US009765445B2

(12) United States Patent
Tucker et al.

(10) Patent No.: US 9,765,445 B2
(45) Date of Patent: Sep. 19, 2017

(54) BRANCHED NANOWIRES AND METHOD OF FABRICATION

(71) Applicant: The Governors of the University of Alberta, Edmonton (CA)

(72) Inventors: Ryan Thomas Tucker, Edmonton (CA); Allan Leo Beaudry, Edmonton (CA); Joshua Michael LaForge, Edmonton (CA); Michael Thomas Taschuk, Edmonton (CA); Michael Julian Brett, Edmonton (CA)

(73) Assignee: The Governors of the University of Alberta, Edmondton, Alberta (CA)

( * ) Notice: Subject to any disclaimer, the term of this patent is extended or adjusted under 35 U.S.C. 154(b) by 900 days.

(21) Appl. No.: 14/092,720

(22) Filed: Nov. 27, 2013

(65) Prior Publication Data

US 2014/0220340 A1    Aug. 7, 2014

Related U.S. Application Data

(60) Provisional application No. 61/730,206, filed on Nov. 27, 2012.

(51) Int. Cl.
| | |
|---|---|
| *C03B 11/12* | (2006.01) |
| *C30B 11/12* | (2006.01) |
| *C30B 29/66* | (2006.01) |
| *C30B 29/60* | (2006.01) |

(52) U.S. Cl.
CPC ............ *C30B 11/12* (2013.01); *C30B 29/607* (2013.01); *C30B 29/66* (2013.01); *Y10T 428/2922* (2015.01)

(58) Field of Classification Search
CPC ........ C30B 11/12; C30B 29/607; C30B 29/66
See application file for complete search history.

(56) References Cited

U.S. PATENT DOCUMENTS

| | | | |
|---|---|---|---|
| 8,282,993 B2* | 10/2012 | Lu ......................... | B22F 1/0018 427/250 |
| 2011/0245074 A1* | 10/2011 | Smith ..................... | B01J 23/30 502/309 |

OTHER PUBLICATIONS

Haacke, G., "New figure of merit for transparent conductors," Journal of Applied Physics 47, 4086 (1976).
S. I. Castañeda et al., "Whiskers in indium tin oxide films obtained by electron beam evaporation" J. Appl. Phys., 83 (1998) pp. 1995-2002.
S. Takaki et al., "Growth Mechanism of Indium Tin Oxide Whiskers Prepared by Sputtering," Jpn. J. Appl. Phys., 46 (2007) pp. 3537-3544.

(Continued)

*Primary Examiner* — Errol Fernandes
(74) *Attorney, Agent, or Firm* — Anthony R. Lambert

(57) ABSTRACT

A new set of branched nanowire or nanotree structures and their fabrication process. Some structures have one or more of the following distinctions from other branched nanowires: (1) the trunk and branch diameter and branching number density can be changed along the trunk's length; (2) the branch's azimuthal direction can be controlled along the trunk's length; (3) the branch's diameter can be modulated along its length; (4) the crystal orientation and branches of the ensemble of nanowires can be aligned on a non-epitaxially matched substrate. The structures are made by a geometrically controlled kinetic growth method.

13 Claims, 11 Drawing Sheets

(56) References Cited

OTHER PUBLICATIONS

Y. Zhong et al., Optical and electrical properties of indium tin oxide thin films with tilted and spiral microstructures prepared by oblique angle deposition J. Mater. Res., 23 (2008) pp. 2500-2505.

K.D. Harris et al., "A Birefringent and Transparent Electrical Conductor," Advanced Functional Materials, 18 (2008) pp. 2147-2153.

C.-H. Chang et al., "Combined micro- and nano-scale surface textures for enhanced near-infrared light harvesting in silicon photovoltaics" Nanotechnology, 22 (2011) p. 095201.

Rider, D. et al., "Indium tin oxide nanopillar electrodes in polymer/fullerene solar cells," Nanotechnology 22 (8) 085706 (2011).

Brett, M.J. and Hawkeye, M.M., "New Materials at a Glance," Science 319, 1192-1193 (2008).

Beaudry, A.L. et al., "Indium tin oxide nanowhisker morphology control by vapour-liquid-solid glancing angle deposition," Nanotechnology 23, 105608 (2012).

Arif S. Alagoz et al: Fabrication of Crystalline Semiconductor Nanowires by Vapor-Liquid-Solid Glancing Angle Deposition (VLS-GLAD) Technique; Mater.Res.Soc.Symp.Proc.vol. 1350; 2011; p. 1-6.

* cited by examiner

BRANCHED NANOWIRES AND METHOD OF FABRICATION

CROSS-REFERENCE TO RELATED APPLICATIONS

This application claims the benefit under 35 USC 119(e) of U.S. provisional application Ser. No. 61/730,206 filed Nov. 27, 2012.

TECHNICAL FIELD

Branched nanowires

BACKGROUND

Branched nanowires, also known as nanotrees, are versatile building blocks that increase achievable complexity in 3D architectures. Developing techniques capable of enhancing directed growth of nanotrees is essential to fully realize their potential for nanodevices. Nanotrees often serve as distributed conductors within a device's active volume, and such percolation networks are applicable in water splitting or photovoltaics. Attaining the electrical connections between adjacent nanowires required for these applications can be accomplished by joining branches, forming 3D networks of nanowires. Unfortunately, producing interconnections between adjacent nanowire branches has, to date, required epitaxial growth, and periodically patterned catalyst seed layers.

Nanotree growth is typically achieved via secondary growth of branches on the side of a vertically aligned nanotree trunk. Vapor-liquid-solid (VLS) growth has been commonly used to direct nucleation and growth of nanotree trunks and branches, although dislocation driven trunk growth has also been demonstrated. Recent progress in controlling branch morphology includes adjusting branch density along the nanotree, placing branches selectively along the height of the trunk, growth of hyperbranched structures, and modulating the branch diameter during growth. Controlled branch placement on selected sides of the trunk has remained elusive. The capability to place branches on a selected side of the trunk would allow for improved control over connectivity in nanowire networks.

Indium tin oxide (ITO) is a transparent conductive oxide (TCO) which is commonly used in organic light emitting devices, flat-panel displays and touchscreens, and organic solar devices. The organic photovoltaic (OPV) community has shown interest in nanostructured ITO films for high surface area electrodes. OPVs are often limited either by light absorption or charge extraction. High surface area electrodes decouple these two limiting factors by allowing for increased absorption while maintaining short charge extraction distances. Conductive pathways throughout the active layer allow the active layer thickness to be increased beyond the exciton diffusion length, motivating development of nanostructured electrodes.

Nanostructured electrodes with increased surface areas have been fabricated using anodic aluminum oxide templates, organic vapor phase deposition and vapor-liquid-solid (VLS) growth of high aspect ratio nanowires. VLS is a crystal growth technique that results in high surface area nanostructures that grow primarily in one dimension. ITO nanowire films can be grown with a self-catalyzed VLS growth mode accessible at elevated substrate temperatures. Beyond applications as high surface area electrodes, ITO nanowires are applicable as gas sensors, protein molecule sensors and UV light sources.

During physical vapour deposition of ITO, self-catalytic indium-tin alloy liquid droplets form on the substrate's surface if the substrate is heated above the alloy's eutectic point. The liquid droplet collects impinging vapour atoms as it has high sticking coefficient (the ratio of atoms adsorbed to the total number of atoms incident on the surface) with respect to the substrate. Nucleation occurs preferentially at the droplet-substrate interface, restricting the nanowire's lateral growth. This results primarily in crystal growth in one dimension, with the primary axis (trunk) normal to the liquid-solid interface.

ITO nanowires exhibit distinctive growth of branches orthogonal to the axial growth direction of the nanowire, reflecting the cubic bixbyite crystal structure of indium oxide. The branching mechanism produces high surface area nanowires, which may improve electrical access to OPV active device layers. ITO nanowire growth has been reported with a large range of substrates, flux rates, vapour incidence angles and deposition techniques.

The vapor-liquid-solid (VLS) mechanism, whereby growth proceeds by precipitation from a liquid catalyst that concentrates the surrounding vapor, has been used to grow crystalline nanowires. Branched nanowires (or nanotrees) can be formed by placing catalytic droplets on the sides of nanowires during growth via a stochastic or engineered process, enabling bottom-up fabrication of complex three-dimensional architectures. Control over intra-wire morphology has also been investigated, with several groups reporting variations in nanowire diameters. Givargizov and others suggest an unstable model of self-oscillations based on droplet contact angle and surface roughness driven by droplet supersaturation. Most of these reports attribute rippled (or bamboo) nanowire structures to this self-oscillatory growth model. However, others have demonstrated discontinuous diameter changes through annealing-driven catalyst migration, switching between different crystal cross-sections during growth, and segmented nanowire morphologies controlled by carrier gas pulsing.

Recently, a geometrical modification of VLS growth through glancing angle deposition (GLAD) was developed. For the self-catalyzed ITO system, this technique (VLS-GLAD) provides additional control over nanowire diameter, spacing, and branching behavior.

Glancing-angle-deposition (GLAD) is a physical vapor deposition technique that utilizes a spatially modulated vapour flux to control thin film morphology.

SUMMARY

A method of producing branched nanowires comprising exposing a substrate to a directional vapor flux, the vapor flux comprising a growth material, the substrate being exposed to the vapor flux under conditions of vapor-liquid-solid growth of the branched nanowires, the conditions including a temperature of the substrate, the vapor flux having a deposition angle representing the angle between a normal direction of the substrate and the direction of the vapor flux, an azimuthal angle representing an angle of the projection of the direction of the vapor flux in the plane perpendicular to the normal direction of the substrate, and a flux rate, and varying at least one of the deposition angle, the azimuthal angle, the flux rate and the temperature to control a property of the branched nanowires.

In various embodiments, there may be included any one or more of the following features: the branched nanowires may have crystal facets and at least one of the deposition angle, the azimuthal angle and the flux rate may be controlled to selectively and sequentially direct the vapor flux to a subset of the crystal facets of a nanowire of the branched nanowires. This method may be used to align in azimuth a plurality of the branched nanowires. The alignment of the plurality of nanowires may change with height. At least one additional source of vapor flux may be used. If there is at least one additional vapor source, at least one of the orientation, position, flux rate and material of the additional vapor source may vary in time. The nanowires may be grown on a substrate with an epitaxial relationship to the nanowires' growth material. The nanowires are grown on a substrate without an epitaxial relationship to the nanowires' growth material. The substrate may be one of a semiconductor, glass, smooth thin film, columnar thin film, or nanostructured thin film. The substrate may have surface properties causing the nanowires to cluster in a region of the substrate. The surface properties of the substrate may be geometrically designed to invoke a specific behavior in the growing nanowires. The azimuthal direction of the vapor flux may rotate continuously clockwise or continuously counterclockwise. The azimuthal direction of the vapor flux may oscillate with an amplitude between 0 and 360 degrees. The azimuthal direction of the vapor flux may change discretely.

All permitted combinations of the disclosed embodiments.

These and other aspects of the device and method are set out in the claims, which are incorporated here by reference.

BRIEF DESCRIPTION OF THE FIGURES

Embodiments will now be described with reference to the figures, in which like reference characters denote like elements, by way of example, and in which.

DETAILED DESCRIPTION

Figure 1:
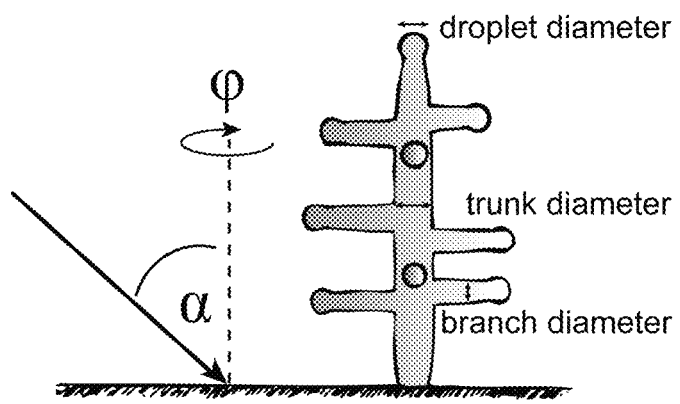
FIG. 1 is a schematic diagram showing relevant geometric process parameters, such as the deposition angle α, and the azimuthal angle φ. Droplet, trunk and branch diameter are also shown and labelled. The flux rate, incoming along the vector defined by φ and α, also affects the process, but is not shown in this figure.

A method of producing branched nanowires, the method comprising exposing a substrate to a vapor flux at a deposition angle under conditions of vapor-liquid-solid growth and varying at least one of vapor flux, deposition angle and azimuthal angle. Specific designs of branched nanowires are also disclosed.

Embodiments Include

A. Vapor liquid solid growth of nanostructures on a substrate where the incident vapor flux is directional and a deposition parameter is varied.

B. The method of embodiment A where the parameter is varied or modulated as a controlled function in time.

C. The method of embodiment A where a parameter for one or more vapor sources is varied.

D. The method of embodiment A where the parameter is the angle between the normal direction of the substrate and the direction of vapor flux.

E. The method of embodiment A where the parameter is the rate of vapor flux.

F. The method of embodiment A where the parameter is the azimuthal angle of the direction of vapor flux about the normal direction of the substrate.

G. The method of embodiment A where the parameter is the temperature of growth.

Other Embodiments Include

H. A method for growing crystalline nanowires, and dependent and/or connected epitaxial or non-epitaxial branches thereof, where a plurality of the nanowires are aligned in azimuth, aligned in altitude, and in both azimuth and altitude, through selectively and sequentially directing growth material's vapor to a subset of the growing nanowire's crystal facets I. The method of embodiment H where the where the growth material vapor flux may be directed by one or more discrete sources, whose relative orientation, position, rate, and material may be a function of time J. The method of embodiment H where the alignment of the nanowires, and dependent epitaxial or non-epitaxial branches thereof, changes with height K. The method of embodiment H where the growth material's vapor arrival rate at a subset of the growing nanowire's crystal facets oscillates continuously around a fixed value, or in a sequence of fixed values L. The method of embodiment H where the growing crystalline nanowires are grown on a substrate, with or without an epitaxial relationship to the nanowire's growth material, such as, but not restricted to, semiconductor, glass, smooth thin film, columnar thin film, or nanostructured thin films M. The method of embodiment H where the growing nanowires are grown on a substrate with periodic or non-periodic surface properties, such that the growing nanowires cluster in a given region N. The method of embodiment M where the surface properties of the substrate are geometrically designed to invoke specific behavior in the growing nanowires.

Still Further Embodiments

O. The method of embodiment H where the growth material's azimuthal direction increases continuously.

P. The method of embodiment H where the growth material's azimuthal direction oscillates continuously, with an amplitude between 1 degree and 359 degrees, around a single azimuth.

Q. The method of embodiment H where the growth material's azimuthal direction increases discretely R. The method of embodiment H where the growth material's altitude changes in discrete steps, producing layers with different branching character S. All permitted combinations of the disclosed embodiments Vapor-liquid-solid (VLS) growth is a method for nanowire structures. Vapor collects in the liquid droplet until it reaches a supersaturated state. A crystal solid is precipitated from the droplet, typically onto a substrate. The droplet is lifted by the growing nanowire, and through control of the droplet's chemical and physical properties, the nanowire's nature may be controlled. The phase diagram of the liquid alloy indicates what phase of crystal is precipitated in order to reestablish equilibrium.

VLS growth requires a growth material and compatible catalyst in terms of solubility, surface energy, and phase at growth temperature. The alloy of growth material and compatible catalyst in the case of a non-self-catalytic growth material must be liquid at growth temperature, and the precipitated solid must be the desired phase, as determined by the phase diagram of the alloy.

Exploitation of unique aspects of vapor-liquid-solid glancing angle deposition (VLS-GLAD) produces new nanostructure types and nanostructure control. The VLS-GLAD technique is extremely flexible, and should be compatible with any material capable of vapor-liquid-solid growth and on any substrate compatible with the material chemistry. Our technology in its various aspects can control branch height, orientation, and branch diameter through precise control of growth conditions. Substrate epitaxy is not required, but is complimentary.

The requirements for VLS catalysts according to Wikipedia are:

The catalyst must form a liquid solution with the crystalline material to be grown at the nanowire growth temperature.

The solid solubility of the catalyzing agent is low in the solid and liquid phases of the substrate material.

The equilibrium vapor pressure of the catalyst over the liquid alloy must be small so that the droplet does not vaporize, shrink in volume (and therefore radius), and decrease the radius of the growing wire until, ultimately, growth is terminated.

The catalyst must be inert (non-reacting) to the reaction products (during CVD nanowire growth).

The vapor-solid, vapor-liquid, and liquid-solid interfacial energies play a key role in the shape of the droplets and therefore must be examined before choosing a suitable catalyst; small contact angles between the droplet and solid are more suitable for large area growth, while large contact angles result in the formation of smaller (decreased radius) nanowires.

The solid-liquid interface must be well-defined crystallographically in order to produce highly directional growth of nanowires. It is also important to point out that the solid-liquid interface cannot, however, be completely smooth. Furthermore, if the solid liquid interface was atomically smooth, atoms near the interface trying to attach to the solid would have no place to attach to until a new island nucleates (atoms attach at step ledges), leading to an extremely slow growth process. Therefore, "rough" solid surfaces, or surfaces containing a large number of surface atomic steps (ideally 1 atom wide, for large growth rates) are needed for deposited atoms to attach and nanowire growth to proceed.

Some known VLS Materials are shown in the table below
Some growth materials require a distinct catalyst materials, others, like ITO, are self-catalyzing.

| Growth material | Catalyst material |
|---|---|
| $In_2O_3$:Sn (ITO) | Indium/Tin, Gold |
| Si | Gold, Fe, Ru, Pr, Al, Cu, Bi |
| Ge | Gold |
| ZnO | Cu |
| Carbon | Ni |
| ZnS | Au |
| GaAs | Au, Ag, Cu, Ga |
| GaN | Self, |
| InP | Au |
| InAs | Au |
| CdS | Au |
| CdSe | Au |
| SiGe | Au |
| ZnSe | Au |
| InAsP | Au |
| $Al_2O_3$ | |
| SiC | |
| $In_2O_3$ | Au |
| GaP | |
| SiO2 | |
| GaP | Au |
| $Ge_{1-x}C_x$ | Au |
| PbSe | In |
| $Ga_2O_3$ | Au |

The number density of nanowires (i.e. number per area) can be controlled by selecting a self-catalyzed VLS material and deposit within VLS regime parameters. For indium tin oxide (ITO), nanotree density can be tuned by deposition angles between $\sim 50° \leq \alpha \leq 90°$, and by flux rates between 0.05 nm s$^{-1}$ and 3 nm s$^{-1}$.

Branched nanowires, or nanotrees, can be formed in catalyzed and self-catalyzed systems via the placement of catalyst material on the sides of trunks. VLS-GLAD enables selective placement of catalyst material on desired growth surfaces for catalyzed and self-catalyzed systems, enabling enhanced branch placement and orientation control. This has been demonstrated for self-catalyzed VLS growth of ITO nanotrees.

Nanowire diameter and branch density along the axis of a nanotree may be tuned by varying deposition angle and flux rate. Nanowire trunk diameter increases with flux rate in the range of 0.05 nm s$^{-1}$ to 3 nm s$^{-1}$, and decreases with deposition angle between 70° and 90°.

Control of average branch placement about the azimuthal angle of a nanowire at a specific height is accomplished by adjusting the restricted azimuthal range of incident flux as a function of height, and requires control of the trunk's azimuthal orientation with respect to the material flux. The restricted azimuthal range can be constant, vary continuously, or in discrete steps as a function of height; each produces a different structure.

Branch diameter can be controlled along the branch axis by controlling the incoming flux to the branch in two ways: (i) adjusting the local shadowing of a branch through control of azimuth and deposition angle, and (ii) varying the flux rate.

Nanowire structure alignment in the substrate plane is achieved through controlling the trunk's azimuthal orientation. The azimuthal distribution of the material flux should be matched to the VLS material's crystal properties (2-fold, 3-fold, 4-fold or 6-fold, rotational symmetry), so that the azimuthal positions of the flux throughout the course of the deposition reflect the n-fold symmetry of the desired structures. Preferential branch alignment results in films of nanotrees grown using this technique. No epitaxial relationship with the substrate is required.

Density can be modified with film height by modulating a during growth between low ($0° \leq \alpha \leq \sim 50°$) and high ($\sim 50° \leq \alpha \leq 90°$) values so that the morphology of the growth switches between randomly networked (low $\alpha$ values) and branched nanotrees (high $\alpha$ values).

Terms and Definitions

Deposition angle ($\alpha$): The angle between the source material flux and substrate normal.

Azimuthal angle ($\phi$): The angle of azimuthal rotation (i.e. about substrate normal).

Flux rate: The rate of material vapor flux incident on the substrate. Measured in equivalent planar thickness per time (nm s$^{-1}$).

Number density: The number of objects in a given area (areal number density), or number of objects along a certain distance (linear number density).

Trunk: The part of the branched nanotree that has branches attached to it, typically attached to a substrate or surface other than another nanotree.

Branches: The nanowires that are attached to another nanowire (or trunk).

Growth material: The material that the nanotree is comprised of.

Catalyst material: The material which makes up the catalyst droplet for VLS growth. The catalyst material is the same as the growth material for self-catalyzed systems.

Catalyst Seed: Catalyst material droplet that can grow a nanowire.

Self-catalyzed: A material system where the material necessary for a VLS catalyst droplet is the same as, or included in, the growth material.

Nanotree: A branched nanowire.

FIG. 1 defines relevant geometric process parameters, such as the deposition angle $\alpha$, and the azimuthal angle $\phi$. Parameters relevant to the nanostructure are also shown and labelled. The flux rate, incoming along the vector defined by $\phi$ and $\alpha$, also affects the process, but is not labeled in FIG. 1.

Deposition angle can be used to control of nanotree areal number density and branch linear number density as follows: select a material that undergoes self-catalyzed VLS. These include, but are not limited to indium tin oxide (ITO), gallium nitride, indium phosphide, zinc oxide, etc; and deposit material at glancing angles (~50°≤α≤90°) onto substrate heated to required temperature for self-catalyzed VLS. The choice of a affects both the areal number density of the nanotrees and the linear number density of branches along the trunk.

Flux rate can be used to control nanowire density and branch density as follows: select a material as in the previous paragraph; and for a given a, the areal number density and diameter of the nanotrees can be adjusted by changing the flux rate. We have demonstrated this effect for flux rate values between 0.05 nm s$^{-1}$ and 3 nm s$^{-1}$. Increased flux rates produce nanotrees with larger diameters (trunk and branch), lower areal number density and lower linear number density of branches.

Branched nanowires can be formed via VLS-GLAD through the placement of catalyst material on the sides of trunks. For materials that are not self-catalyzed a two-step process is necessary. Catalyst material can be deposited on the sides of a trunk, followed by deposition of growth material at appropriate VLS growth conditions.

A one-step process is possible when the growth material is self-catalyzed. Simultaneous deposition of the growth material and catalyst material will place catalyst droplets on the sides of trunks and grow them. This has been demonstrated.

VLS-GLAD allows for catalyst material to be placed selectively on desired growth surfaces, improving branch placement.

Flux rate can be used for branch and diameter control along the height of nanotrees. The types of branches and trunk/branch diameter at a given height can be controlled through flux rate using the following process steps. The process also controls the diameter of trunks in branch-free VLS systems.

For each height or layer (minimum of two), determine the required flux rate to achieve desired branching and diameter characteristics.

Deposit the first layer at the flux rate to produce the required diameter and branching character.

Change flux rate to that required for the next layer to produce the required branching and diameter character. The rate of change in flux rate will influence the transition between layers.

Repeat the steps of depositing a layer and changing the flux rate to that required for the next layer until the desired structure has been achieved.

The flux rates that have been shown to work are between 0.05 nm s$^{-1}$ and 3 nm s$^{-1}$ for ITO.

The density of branches along the height of the nanotrees can be modulated by changing the deposition angle during growth.

For each height or layer (minimum of two), determine the required deposition angle to achieve desired branching characteristics.

Deposit the first layer at the flux rate to produce the required branching character.

Change deposition angle to that required for the next layer to produce the required branching character. The rate of change in deposition angle will influence the transition between layers.

Repeat the steps of depositing a layer and changing the deposition angle until the desired structure has been achieved.

Control of branch placement about the azimuthal angle of a nanowire is accomplished by adjusting the restricted azimuthal range of incident flux as a function of height, and requires control of the trunk's azimuthal orientation with respect to the material flux. There are three distinct processes which restrict azimuthal orientation of the branches, and a fourth general category that combines the azimuthal restriction with deposition angle and rate modulation. These methods described here focuses on self-catalyzed materials, analogous procedures for catalyzed VLS materials are available.

Branch placement has been demonstrated for the self-catalyzed ITO system, and should be extendable to both catalyst seed placement and branch growth for catalyzed systems.

Branches can be placed selected sides of a trunk at all heights by the following:

Determine the required deposition angle and flux rate to achieve desired branching characteristics.

Deposit the VLS material without changing azimuth.

We have demonstrated this structure for different deposition angles.

Branches can be placed on different sides of the trunk as a function of height. The average side a branch is on may continuously vary as a function of height. Examples include chiral (azimuth increases in one direction), bi-directional (azimuth increases in one direction, then reverses), or oscillatory (azimuth oscillates around a single azimuth, as in PhiSweep). These may be achieved using the following process steps.

Determine the required deposition angle and flux rate to achieve desired branching characteristics.

Deposit the VLS material using the desired azimuthal pattern

We have demonstrated this structure for azimuthal rotation rates between 1 nm/rotation and 1000 nm/rotation. The bi-directional and oscillatory modes achieve preferential growth on three azimuthally adjacent branching directions, or two opposing branching directions.

Branches may be placed on different sides of the trunk as a function of height, with the average side varying periodically as a function of height. Examples include chevron or polygonal spiral structures, where the azimuthal direction of the vapor flux changes periodically.

For a self-catalyzed VLS material, this may be achieved with the following steps.

Determine the required deposition angle and flux rate to achieve desired branching characteristics.

Deposit the VLS material using the desired azimuthal pattern.

We have demonstrated chevron, or two-fold periodically varying orientations. Analogous procedures are available for catalyzed VLS materials.

The techniques described here can be used in combination to provide additional control over branch placement. For example, flux rate and azimuthal orientation can be used in combination to control branch density as a function of height.

Branch diameter can be controlled along the branch axis by controlling the incoming flux to the branch.

To control branch diameter by shadowing, the following steps may be used.

Adjust motion in the $\phi$ and possibly $\alpha$ so that branches move in and out of the flux shadow cast by neighbouring structures.

The rate of motion must be optimized so that shadowing occurs at a longer time scales than the droplet kinetics; there must be sufficient time for precipitation out of the droplet to cause it to shrink and absorption of the droplet to cause it to grow during a shadowing cycle.

The rate of motion in step will be affected by other deposition conditions such as temperature, effective flux rate, and residual gas concentration. This has been demonstrated for ITO at flux rates in the range of 0.05 nm s$^{-1}$ to 3 nm s$^{-1}$ with rotation period dependent on the flux rate.

To control branch diameter by macroscopic flux control, the following steps may be used.

Modulate the flux rate at the vapor source to create starve and feed cycles at the droplet. For example, shuttering of the vapor source can be used to turn the flux on and off.

A combination of shadowing and macroscopic flux control can be used simultaneously to control rippling (branch diameter).

The local flux modulation rate performed by shadowing, macroscopic flux control or a combination thereof must be optimized so that starve-feed cycles at the droplet occur at longer time scales than the droplet kinetics; there must be sufficient time for precipitation out of the droplet to cause it to shrink and absorption of the droplet to cause it to grow during each cycle. Optimization of the flux modulation rate will be affected by other deposition conditions such as temperature, effective flux rate, and residual gas concentration.

Alignment of the nanowire structures in the substrate plane is achieved through control of the trunk's azimuthal orientation by the following steps.

Determine the in-plane symmetry for structures that are aligned with their growth axis parallel (on average) to the substrate normal. The structures can be branched or unbranched nanostructures deposited at some arbitrary deposition angle $\alpha$. For example the structures might exhibit 2-fold, 3-fold, 4-fold or 6-fold, rotational symmetry in-plane of the substrate depending on the crystal structure of the material and the epitaxial relationship between the branches (if any) and trunk. This symmetry can be found by X-ray diffraction techniques (pole figures) or from direct imaging of the structures with plan-view electron micrographs. Imperfections from ideal symmetry may be seen in electron micrographs and are tolerated by this process.

From knowledge of the in-plane symmetry design the motion of the flux for a separate deposition so that the azimuthal positions of the flux throughout the course of the deposition reflect the n-fold symmetry of the structures. Lower order symmetries can be used, for example 3-fold flux for 6-fold structures and 2-fold flux for 4-fold structures.

Adjust the starting position of $\phi$ during the deposition to accommodate relative orientation with the substrate if desired.

Deposit a second film using the n-fold azimuthal symmetry of the flux. This can be accomplished in several ways.

With one vapor source, by rapidly moving between discrete $\phi$ positions, for example $\phi=0°$, $\phi=90°$, $\phi=180°$ and $\phi=270°$ in 4-fold cases. The speed of rotation between these positions is often important.

With multiple vapor sources, by simultaneously depositing from discrete $\phi$ positions.

With one vapor source, or multiple vapor sources, by designing some other motion pattern where the distribution of flux in the azimuthal direction reflects the natural symmetry of the structures.

Choice of motion made in depositing the second film will affect the film thickness required to achieve in-plane alignment. To achieve in-plane alignment with less film thickness, optimization is required. For example the speed of rotation and dwell times at each $\phi$ position can be adjusted. Additionally, the choice in optimization will also be affected by other deposition parameters, such as temperature, flux rate and residual gas concentration.

To modify density with film height, modulate $\alpha$ during growth between low and high values so that the morphology of the growth switches between randomly networked (low values) and branched (high values).

For each layer (minimum of two), determine the required deposition angle $\alpha$ to achieve either branched or randomly networked morphologies.

Deposit the first layer with the desired morphology at $\alpha_1$.

During deposition move to $\alpha_2$ to deposit the second layer. The rate of change in $\alpha$ will influence the transition between layers.

Repeat step of depositing a layer with $\alpha_3$, $\alpha_4$, $\alpha_5$ ... until the desired structure has been achieved.

A new growth technique for indium tin oxide nanowires with increased control over feature size and spacing is reported. The technique is based on a unique combination of self-catalyzed vapour-liquid-solid (VLS) growth and glancing-angle deposition (GLAD). Spatial modulation of the collimated growth flux controls trunk width, number and orientation of branches, and overall nanowire density. Here we report the influence of growth conditions (including deposition angle, flux rate, nominal pitch and substrate temperature) on nanowire morphology, with specific focus on the effect of large deposition angles. Sheet resistance and transmission of the films were measured to characterize their performance as transparent conductive oxides. Hybrid nanostructured films grown in this study include high surface area nanowires protruding from a conductive film, ideal for transparent conductive electrode applications.

Our group has been studying the optical and device performance of nanostructured GLAD ITO thin films deposited using electron-beam evaporation.

By combining GLAD's control over the vapour flux with a heated substrate to induce VLS growth of ITO, we are able to precisely control ITO nanowire morphology in a hybrid crystal growth technique named VLS-GLAD. In terms of a parameter space of temperatures and deposition angles, The VLS-GLAD region resides at elevated temperatures and high deposition angles ($\alpha$). GLAD has high deposition angles, and VLS has elevated temperatures. Ordinary planar deposition may have low temperatures and low deposition angles. Here we report a systematic characterization of the effects of flux rate, angle of vapour incidence relative to substrate normal ($\alpha$), pitch (nominal film thickness deposited per substrate rotation) and substrate temperature on ITO nanowire morphology. The density of preferential nucleation sites, and subsequently trunk density, is determined by the extent of geometric shadowing (controlled by $\alpha$) caused by catalytic liquid indium-tin alloy droplets during nucleation. In addition, unique ITO nanowire morphology is obtainable via manipulating deposition angle, pitch and flux rate during growth. We examine the effects of deposition parameters on the nanowire morphological properties expected to optimize OPV performance when used as an electrode, including trunk diameter, branch diameter (defined in FIG. 1), and trunk density, defined as the number of trunks per micrometer squared. The sheet resistance and transmission of each film is measured and Haacke's figure of merit (FOM) is calculated to quantify film performance as a TCO.

Experimental Setup

Film Fabrication

ITO nanowire films were deposited using a high vacuum (base pressure below 0.1 mPa) electron beam evaporation system with a custom substrate motion controller capable of precisely controlling α (angle of vapour incidence) and φ (angle of substrate rotation around substrate normal). Substrate temperature was controlled by two halogen lamps illuminating substrates on a copper chuck. Temperature was monitored by a cold-junction corrected (ASTM E2730-10 standard) thermocouple held approximately 1 cm above the substrate holder. This position exposed the thermocouple to the same vapour flux and radiative loading as the substrate, but still allowed for substrate rotation. The distance between the source and substrate was 42 cm. The ITO source composed of pure 3 mm to 12 mm pieces of $In_2O_3$:$SnO_2$ (91:9% mol.; 99.99% purity; Cerac, Inc.). No process gas was added during deposition. The films were grown on Si wafers (<100>; p-type; University Wafer), quartz (Quartz Scientific), B270 glass (Howard Glass Co.) and commercial ITO on float glass (Delta Technologies, Ltd.). The films were deposited at across a range of depositions angles (30° to 90°), pitch values (1 nm nominal to 1000 nm nominal), flux rates (0.05 nm/s nominal to 2 nm/s nominal) and substrate temperatures (80° C. to 240° C.). We estimate effective source diameter to be approximately 1 cm. This large source area permits deposition even at deposition angle of 90°, as the source is not fully occluded by the substrate holder.

A two-stage annealing process was performed on the nanowire films deposited on quartz substrates to improve the properties as a transparent conductor. The first stage anneal was initiated with a ramp rate of 10° C. per minute from room temperature to 500° C. in atmosphere then held for 90 minutes. The samples were removed after passively cooling to 90° C. Sample transmissivity increased after this first stage, but conductivity was typically decreased. The second stage anneal was performed in a three-zone tube furnace. Forming gas consisting of 5% $H_2$ (balance Ar) was flown over the samples at a rate of 100 standard $cm^{-3} \cdot min^{-1}$ during anneal. The samples were ramped linearly to 375° C. in 90 minutes, held at 375° C. for 60 minutes, and then allowed to passively cool to below 90° C. before removal. Conductivity was typically increased after the second anneal stage with little change to the transmissivity.

Film Characterization

A scanning electron microscope was used to image the films (15 kV accelerating voltage). Films deposited on Si substrates were imaged without further coating, whereas films deposited on quartz, B270 glass, or commercial ITO on float glass were coated with approximately 10 nm Cr to reduce charging. Trunk diameter, droplet diameter, branch diameter, trunk density, and nearest neighbour distance were measured by analyzing cross-sectional and top-down SEM images of uncoated ITO nanowires on Si substrates. Length and diameter values were averaged over five measurements using image analysis software. Nearest-neighbour distance was estimated as the mean of a gaussian distribution fit to the distances between all unique trunk pairs for each image. X-ray diffraction patterns were taken on the films deposited on Si substrates using a Cu $K_\alpha$ radiation, a 0.5 mm collimator, and an area detector at a distance of 15 cm. Transmission electron microscopy (TEM) was used to image select ITO nanowires, and to further analyze the crystal structure. Transmission spectra of the films on quartz substrates were taken from 185 nm to 3300 nm using a spectrophotometer. Film sheet resistance (quartz substrate) was measured using a four point probe. Transmission and sheet resistance measurements were conducted before and after each annealing stage. Film performance as a TCO was determined by Haacke's figure-of-merit, defined by:

$$F_H = \frac{T^x}{R_s} \quad (1)$$

where $R_s$ is sheet resistance, T is optical transparency (averaged over 400 nm<λ<780 nm) and x=10, typically. Typical device grade planar ITO films have $2 \cdot 10^{-3} \cdot \Omega^{-1} < F_H < 22 \cdot 10^{-3} \cdot \Omega^{-1}$.

Nanowire Morphology

Cross-sectional and top-down SEM images of VLS-GLAD ITO nanowire films deposited with an increasing deposition angle (α) were taken. At elevated α, larger droplets may starve smaller droplets of flux via an increase in geometric shadowing, leading to a decreased subset of droplets producing trunks. Increasing deposition angle results in the growth of fewer nanowires over the same substrate area, consistent with the competitive growth model used to describe reduced number density of features in GLAD films.

Figure 2:
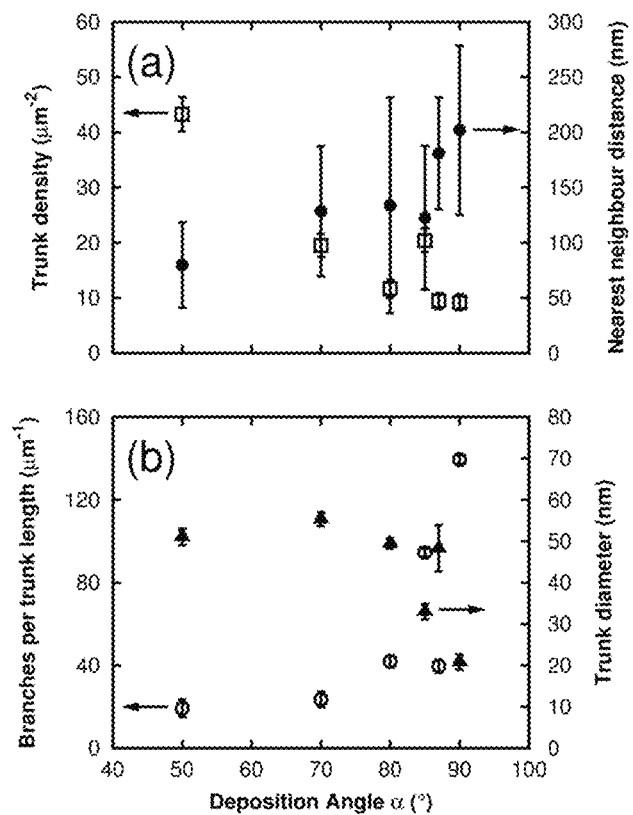
FIG. 2 is a graph showing measured parameters for VLS-GLAD nanowires deposited at various deposition angles (a) trunk density per unit area and nearest neighbour distance, and (b) average branches per unit trunk length and trunk diameter. Error bars indicate standard deviation (nearest neighbour distance, trunk diameter) or propagated counting error (trunk density, branches per trunk length).

The relationship between deposition angle and number density of trunks, nearest neighbour distance, number of branches and trunk diameter is quantified in FIG. 2. FIG. 2 is a graph showing measured parameters for VLS-GLAD nanowires deposited at various deposition angles (a) trunk density per unit area and nearest neighbour distance, and (b) average branches per unit trunk length and trunk diameter. Error bars indicate standard deviation (nearest neighbour distance, trunk diameter) or propagated counting error (trunk density, branches per trunk length). Interestingly, the trunk diameter also appears to be a function of alpha, peaking in width at around α=70°. The number of branches per unit trunk length increase rapidly with increasing deposition angle. Branch formation seems dependent on the amount of flux incident on the side of the trunk, which is controlled by geometric shadowing from nearby nanowires. With increasing deposition angle, the combination of decreasing trunk diameter and increasing trunk-to-trunk spacing results in decreasing shadowing from neighbouring nanowires. These dominant geometric effects appear to increase flux incident on trunk sides and thus increase branching.

Figure 3:
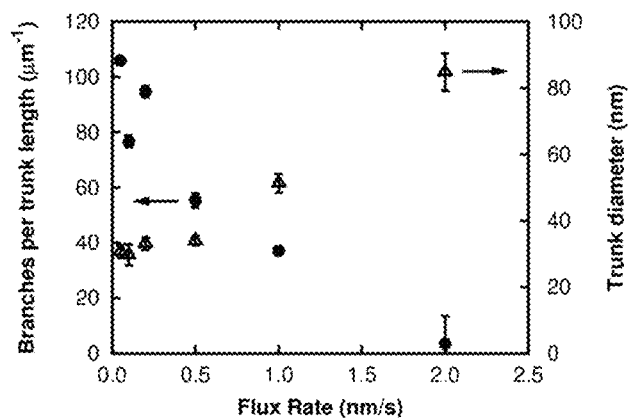
FIG. 3 is a graph showing average number of branches per unit trunk length and trunk diameter measured for VLS-GLAD nanowires grown at α=85° and varying flux rate.

Nominal flux rate has a strong impact on film morphology, as seen in FIG. 3. FIG. 3 is a graph showing average number of branches per unit trunk length and trunk diameter measured for VLS-GLAD nanowires grown at α=85° and varying flux rate. For films deposited at large deposition angles, increasing flux rate results in a reduction in the number of branches and an increase in both trunk and branch diameter. Measurements for these parameters are shown in FIG. 3 Typical VLS growth is described as having two transitions: vapour-to-liquid and liquid-to-solid. Increasing the flux rate will proportionally increase the rate of material crossing the vapour-to-liquid interface. The liquid droplet size will hence increase until the rate of liquid-to-solid transition (related to the area of this interface) has increased as well. The increase in size of the liquid droplets thereby increases trunk diameter. The decrease in branching with increasing rate also appears to be related to geometrical shadowing. As trunk diameter increases with flux rate and trunk-to-trunk spacing remaining relatively constant, the trunk sides are increasingly shadowed from incoming flux. This decrease in flux incident on the trunk sides leads to branching decreasing to nearly zero in the largest flux rate case.

Figure 4:
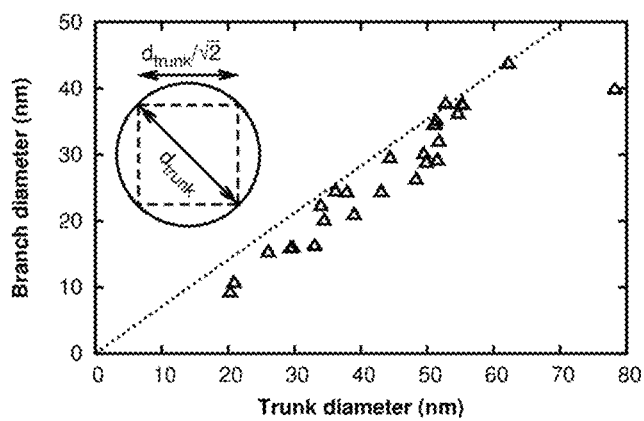
FIG. 4 is a graph showing branch diameter v. trunk diameter. For all deposited films, branch diameter has an upper limit of $1/\sqrt{2}$ of the trunk diameter. The dotted line represents the side length of the inscribed square of the trunk's circular cross-section, as illustrated in the inset figure.

For all VLS-GLAD films grown across a large range of temperatures, flux rates, deposition angles, and rotation rates, the branch diameter seems to be limited to a portion of trunk diameter. This upper bound is located at a fraction of $1/\sqrt{2}$ of the trunk diameter, representing the side length of the inscribed square in the trunk's circular cross-section. FIG. 4 is a graph showing branch diameter v. trunk diameter. The dotted line represents the side length of the inscribed square of the trunk's circular cross-section, as illustrated in the inset figure. The observed geometrical restriction to branch diameter suggests the branches are a continuation of the cubic crystal lattice of the trunk. Therefore, by controlling the initial droplet diameter via the VLS-GLAD mechanism, trunk and branch diameters can be tailored. The control over trunk and branch diameters, as well as the number of branches is a coupled effect between flux rate and incident angle of vapor flux ($\alpha$).

Further investigation regarding the effect of temperature on nanowire morphology will be necessary in future work. It was observed that pronounced nanowire growth begins at temperatures between 130° C. and 165° C., for deposition angles of 50° and 85°. At a reduced temperature of 165° C. VLS growth is noted for lower flux rates. However, at higher flux rates the nanowires begin to appear misshapen or curled. Seemingly without sufficient temperature, the rate of crystallization at the liquid-solid interface cannot increase to match higher flux rates, at which point ballistic growth dominates over kinetic growth.

Pitch (nominal film thickness deposited per substrate rotation) did not appear to have a significant effect on nanowire morphology. However, as pitch approaches infinity (no rotation), preferential branch formation in the direction of incident vapor flux was observed as catalytic liquid droplets form favourably on the edge of the nanowire facing the vapor flux, resulting in branching towards the incident vapor flux. In-depth studies into the effects of substrate rotation will be conducted in future work.

Crystal Structure

Figure 5:
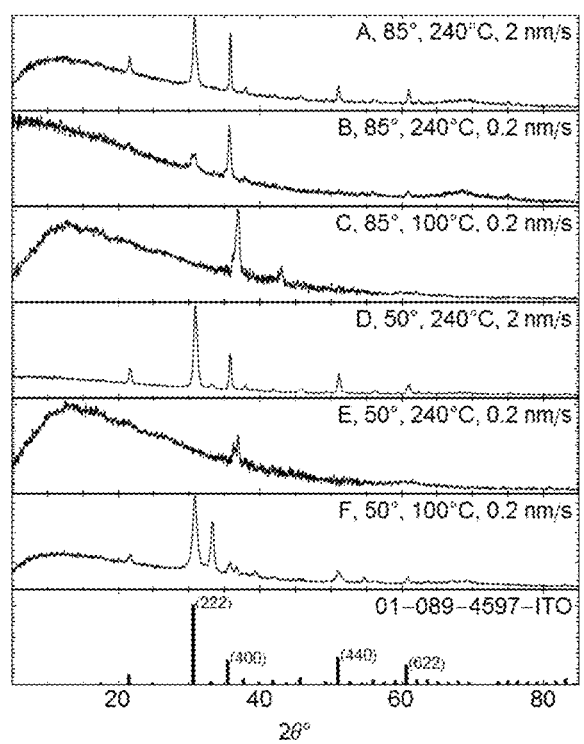
FIG. 5 is a graph showing X-ray diffraction patterns of select samples deposited on Si substrates at a pitch of 10 nm, with variation in deposition angle, substrate temperature and nominal deposition rate. Powder diffraction pattern file for ITO (01-089-4597) is shown for comparison.

Crystal structure of the films was analyzed with x-ray diffraction. Diffraction patterns for as-deposited samples on Si substrates were taken for all deposition conditions studied. A selection of the diffraction patterns chosen to represent the entire set of data is shown in FIG. 5. FIG. 5 is a graph showing X-ray diffraction patterns of select samples deposited on Si substrates at a pitch of 10 nm, with variation in deposition angle, substrate temperature and nominal deposition rate. Powder diffraction pattern file for ITO (01-089-4597) is shown for comparison. Note that the diffraction peaks in samples C ($\alpha$=85°, 100° C., 0.2 nm/s, 10 nm) and E ($\alpha$=50°, 240° C., 0.2 nm/s, 10 nm) where textured. Peaks positions were measured using EVA (Bruker 15.0.0.0) and used to calculate the Smith and Snyder figure of merit for the diffraction patterns for ITO (01-089-4597), $In_2O_3$ (01-072-0683), SnO (01-072-2324), $SnO_2$ (01-078-1063), $SnO_2$ (01-088-0287), Sn (03-065-0297), Sn (03-065-0298) and In (03-065-1172). For the 41 out of 45 samples examined, ITO (01-089-4597) had the largest FOM. The samples with low FOM for ITO exhibit a few discernible ($\leq$3) low-intensity diffraction peaks. Overall these results are consistent with the nanowire films composed of crystalline ITO, as expected. Of the patterns that matched ITO, the (222) and (400) peaks were present in nearly all cases, which is consistent with previously reported <400> and <222> growth directions, along with lattice matched branches occurring orthogonal to the trunk.

The diffraction data was analyzed for trends between the deposition conditions and the crystal properties of the films. This included the crystallite size, Smith and Snyder FOM, strongest peaks present, and percent crystallinity as measured by a ratio between the integrated intensity of the raw line profile and background substrate profile. We did not observe any conclusive trends in these metrics with the deposition conditions including analysis of deposition angle, pitch, nominal flux rate, flux impingement rate on the substrate, and temperature. Any apparent trends in FIG. 5 do not hold across the entire set of samples. In contrast, smooth trends were observed between morphology and deposition conditions as shown in FIG. 2 and FIG. 3. This suggests that film crystallinity and morphology are determined by independent processes.

Transmission electron microscopy (TEM) was performed to further analyze crystal structure. Selected area electron diffraction (SAED) confirmed that the ITO nanowires were single crystal. Aligned crystal lattice planes were observed, with the planes continuing from the trunk into the branch. This supports the geometrical data in FIG. 4, further suggesting that the branches grow as part of the same crystal lattice as the trunk.

Optical and Electrical Properties

Figure 6:
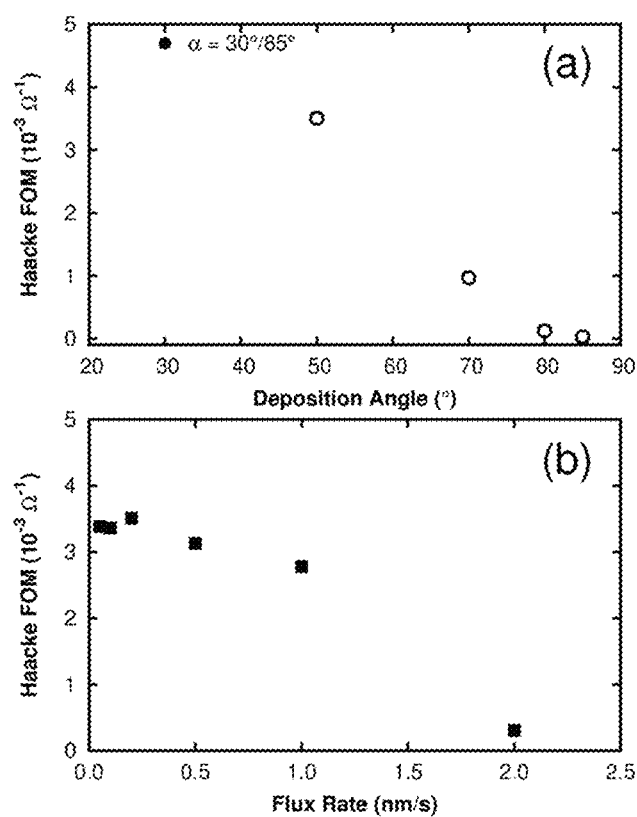
FIG. 6 is a graph showing Haacke figure of merit for VLS-GLAD nanowire films was calculated after the two stage anneal for various flux rates and angles. A deposition angle modulated film where the angle was initially at 30° and changed to 85° "α=30°/85°" is included to the show highest figure of merit attained.

Transmission spectra and sheet resistance were measured and used to calculate Haacke's figure-of-merit (FOM) [Equation 1] for the all of the films presented to determine their feasibility as a TCO electrode. The first anneal increased the transmission of the films and the second anneal decreased the sheet resistance of the films, collectively improving their Haacke's FOM by 1 to 2 orders of magnitude. Haacke's FOM decreased with increasing nominal flux rate at an alpha of 50°. FIG. 6 is a graph showing Haacke figure of merit for VLS-GLAD nanowire films was calculated after the two stage anneal for various flux rates and angles. A deposition angle modulated film where the angle was initially at 30° and changed to 85° "$\alpha$=30°/85°" is included to the show highest figure of merit attained. This may be due to the transition from a dense network of nanowires to thicker disconnected nanowires with increasing rate. In addition, Haacke's FOM decreases with increasing alpha, as expected since high $\alpha$ films are porous.

Having demonstrated the high performance of VLS-GLAD ITO films, we explored the flexibility of our system for different TCO applications. We were able to determine the advantages of various morphologies of nanowires for TCO applications, and design hybrid nanostructures using VLS-GLAD to fabricate ideal TCOs. Films deposited at large deposition angles have a large interfacial area, and good electrical access into an active layer, however use of this morphology depends on using a conductive substrate to provide a common electrode at the base. Dense, interconnected films deposited at small deposition angles have a high Haacke FOM, but do provide good electrical access to the active layer. A combination of these morphology's advantages is attainable by VLS-GLAD modulation during growth, described in the next section.

Hybrid Nanostructures

Modulating the flux rate and deposition angle during growth via VLS-GLAD allows for the precise fabrication of unusual hybrid nanowire structures. These hybrid morphology architectures will provide improved control over the optical and electrical properties of the films. Modulation of the flux rate can be used to adjust the trunk diameter and branch density during growth. In an example, the trunk diameter responded to the flux rate by contracting from 54±4 nm to 23±1 nm as the flux rate was modulated from 1 nm/s to 0.05 nm/s. Similarly, in the trunk diameter responded to the flux rate by contracting from 53±6 nm to 27±2 nm and then expanding back to 56±3 nm as the flux rate was modulated from 1 nm/s to 0.05 nm/s and back to 1 nm/s. The branch diameter and density also respond to the modulation of flux rate. Branching density increases with decreasing flux rate; resulting in a morphology resembling a lobstick tree in the first example, and a trunk with branches only near the center of the trunk in the second example. In a third example the deposition angle was modulated, where a highly interconnected network of nanowires grown at $\alpha=30°$ is transformed back to a nanowire forest morphology at $\alpha=85°$. The control provided by VLS-GLAD allows morphologies and functional properties to be hybridized, providing the possibility to optimize the nanowire properties for a variety of applications.

The film in the third example in the above paragraph is a good candidate for OPV electrodes as the interconnected base of the film serves as a common electrode, and the nanowire forest serves to penetrate the device active layer. The film has a sheet resistance of 81.2 $\Omega \cdot sq^{-1}$ and an average transmission of 90.8%, which results in a Haacke figure of merit value of $4.7\times10^{-3}\Omega^{-1}$. This is a vast improvement over a film of nanowires deposited at high $\alpha(85°)$, which are open-circuits without an underlying conductive layer. Therefore, real-time VLS-GLAD modulation provides the ability to tailor nanowire films for OPV applications.

VLS-GLAD modulated films allow for the hybridization of various nanowire morphologies, including networks of protruding high surface area ITO nanowires connected via continuous under-layers of ITO, ideal for TCO applications. Advanced control over nanowire structure provided by VLS-GLAD should allow for optimization of optical and electrical properties for TCO applications. The VLS-GLAD technique allows the effects of various deposition parameters to be decoupled, which should improve fundamental understanding of nanostructured film architectures.

Combining vapor-liquid-solid growth with glancing angle deposition (VLS-GLAD) facilitates fabrication of branched nanostructures not possible with either technique alone. Indium tin oxide (ITO) nanostructures grown by VLS-GLAD produce extremely porous nanotree structures, where periodic branch diameter oscillations are sometimes observed. We explain this rippled branch growth with a simple model linking the physics governing branch growth to the process variables controlled in VLS-GLAD. The model is verified by inducing specific, aperiodic ripples onto growing ITO branches through macroscopic vapor flux control and manipulation of local shadowing.

Two key features distinguish VLS-GLAD: (i) a collimated (low divergence) flux which breaks flux symmetry at the growth surface, enabling geometrical shadowing effects to mediate the nanowire growth and (ii) three-dimensional substrate motion to orient the flux during growth. Continuous rotation about substrate normal modulates the incident flux on the branches as they pass through the trunk's shadow. In response, the branch diameter oscillates during growth producing a rippled surface. The ripple period is consistent between branches ($\sigma_{RSD}=15\%$), as expected in the trunk-dominated shadowing model. Unlike the self-oscillatory mechanism, surface ripples produced by flux shadowing are controllable through engineering of substrate motion during growth. Here we present our observations of branch surface rippling, derive a model linking branch growth physics to experimentally accessible variables in the VLS-GLAD technique, and verify the explanation by inducing aperiodic ripples into growing branches. As changes in incident flux drive changes in the diameter, this model captures diameter control modulated by both motion-controlled and flux rate. The VLS-GLAD technique provides an opportunity to study VLS growth kinetics, and produce nanostructures that have been previously unachievable.

Figure 7:
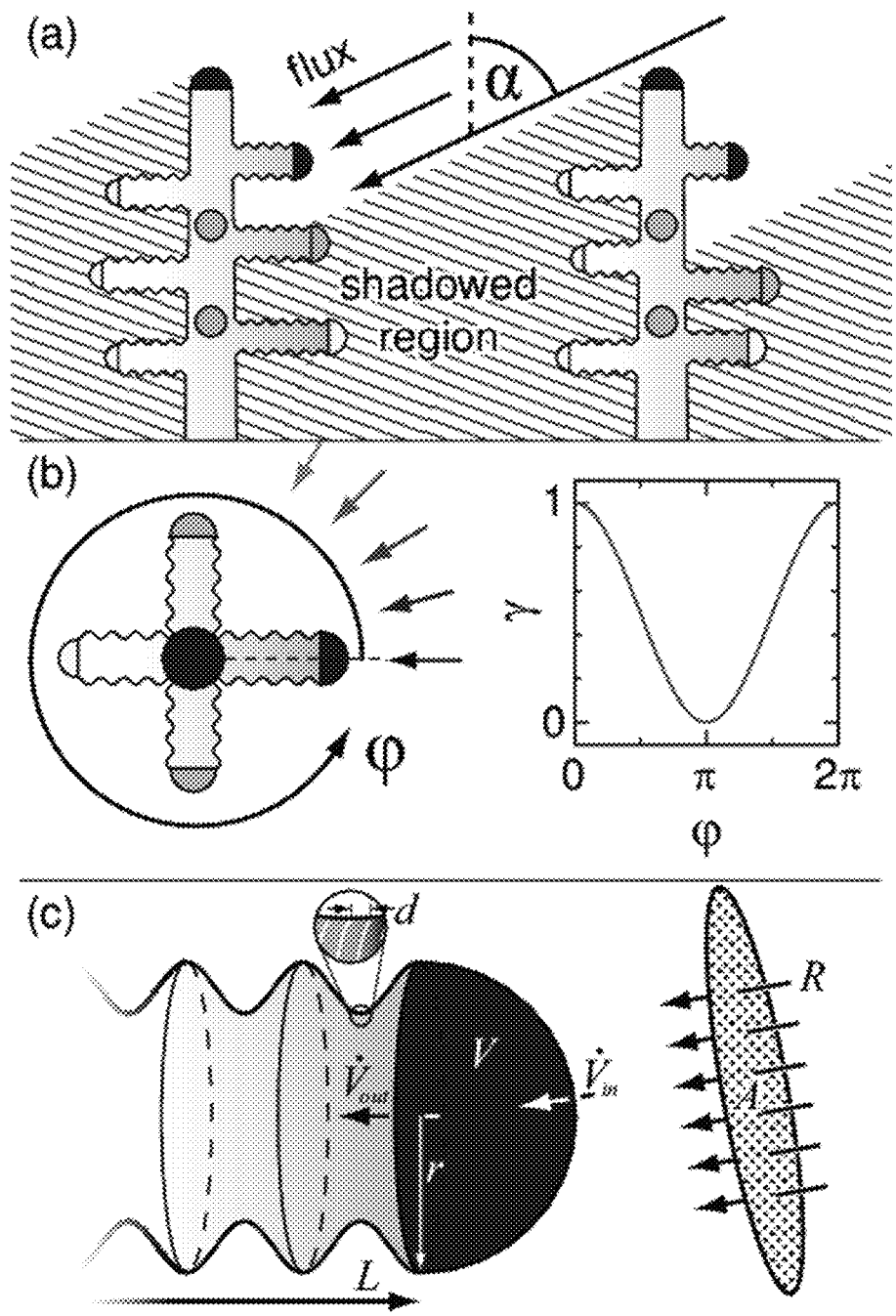
FIG. 7 is a schematic diagram of the VLS-GLAD rippling phenomenon. Side view (a) shows glancing angle (a) and flux shadowing region. Darker droplets are receiving incoming flux and lighter droplet occluded; b) plan view shows rotation of substrate by the angle φ, and flux modulation (γ) at a droplet from shadowing by the attached trunk; (c) droplet radius (r) and volume (V), branch length (L) and monolayer thickness (d), flux rate (R) and capture area (A), and incoming/outgoing volume rates ($\dot{V}_{in}/\dot{V}_{out}$) as used in the model.

FIG. 7 is a schematic diagram of the VLS-GLAD rippling phenomenon. Side view (a) shows glancing angle ($\alpha$) and flux shadowing region. Darker droplets are receiving incoming flux and lighter droplet occluded; b) plan view shows rotation of substrate by the angle $\phi$, and flux modulation ($\gamma$) at a droplet from shadowing by the attached trunk; (c) droplet radius (r) and volume (V), branch length (L) and monolayer thickness (d), flux rate (R) and capture area (A), and incoming/outgoing volume rates ($\dot{V}_{in}/\dot{V}_{out}$) as used in the model.

From mass conservation, droplet diameter is controlled by the vapor flux capture rate and the liquid-solid crystallization rate. Vapor flux capture rate is a function of evaporation conditions, adatom diffusivity, and most importantly for the work presented here, the local shadowing environment a growing nanowire experiences. Unlike typical isobaric VLS-growth systems, the collimated vapor approach used here allows for dynamic control over local vapor pressure. For a growing nanowire array, high deposition angles ($\alpha$) produce shadows between adjacent nanowires, as shown in FIG. 7(a) When deposition flux is occluded by 'upstream' nanowire trunks or branches, the liquid Sn—In(—O) droplet is starved of growth material. Vapor undersupply can lead to droplet decay and subsequently, branch tapering. In some cases, the liquid-solid crystallization process can continue until the droplet is exhausted, resulting in a blunt-ended nanowire.

For a constantly rotating substrate, the incoming flux absorbed by a branch droplet oscillates between minimum and maximum values which depend on the local nanowire environment. A droplet on the side of an isolated nanowire will experience periodic shadowing, resulting in periodic growing and shrinking of the droplet. The growing branch's diameter follows droplet diameter, as long as the droplet does not become completely depleted. FIG. 7b shows this rotational effect on flux arriving at a droplet and its periodic nature in an ideal case. The correct conditions produce periodic ripples along the branch growth direction. However, the GLAD process is tunable, and can produce complex shadowing environments, providing a route to enhancing control of VLS growth.

The schematic in FIG. 7c shows the parameters used in a model relating volume change to both flux rate and rotation rate. Using MATLAB, a single droplet of hemispherical shape was simulated in a finite time domain for varying incoming flux volume. For simplicity, only single branch growth was considered. One type of particle was used, with properties calculated for an average atom in a cubic 91% $In_2O_3$—9% $SnO_2$ lattice: $\rho=7.18$ g/cm$^3$, 55.0 g/mol, and monolayer thickness d=0.233 nm. All vapor phase atoms within a certain projected area, A, were assumed to condense into the liquid droplet (we expect a high probability of adatom diffusion to the liquid droplet within a certain distance[24]). The rate of incoming volume to the droplet ($\dot{V}_{in}$) was calculated:

$$\dot{V}_{in}(t)=RA\gamma(t) \qquad (1)$$

where R is the material flux rate as measured at the QCM in nm/s and $\gamma$ parameterizes the flux modulation due to rotation-induced shadowing or flux shuttering ($0\leq\gamma\leq1$). For continuous rotation, $\gamma(t)=(\sin(2\pi t/\tau_{rot})+1)/2$ where $\tau_{rot}$ is the rotation period in seconds. As neighbouring trunks increase in height, a branch will eventually become completely occluded from the flux. This effect is incorporated as an envelope on $\dot{V}_{in}$. For this work, we approximate the envelope as an exponential of the form $1-e^{\alpha(t-t_{max})}$ where $\alpha$ is a constant and $t_{max}$ is the time for a certain branch to grow. Detailed studies will be required to elucidate the envelope's functional form.

We assume the branch crystallizes in a layer-by-layer, or birth and spread growth mode, with each layer having a circular cross-section of the same radius as the droplet and monolayer thickness of d. We further assume nucleation time dominates layer crystallization time, such that liquid-solid crystallization time ($\tau_{LS}$) is independent of droplet size and constant for growth of an entire branch. In reality, the growth rate is likely dependent on droplet diameter, however, this assumption tolerable for small changes in droplet diameter. The rate of outgoing volume from the droplet is then:

$$\dot{V}_{out}(t) = d\pi r(t)^2/\tau_{LS} \quad (2)$$

where r is the instantaneous radius of the both the droplet and the branch at the liquid-solid crystallization interface. For a growth of a branch of length L in time $t_{max}$, $\tau_{LS} = t_{max} d/L$. Note that this is not valid at extremely slow rotation rates where the droplet becomes extinct. At each time step $t_i$ of length $\Delta t$, the instantaneous droplet volume and droplet/branch radius were then calculated:

$$V(t_i) = V(t_{i-1}) + \dot{V}_{in}(t_i)\Delta t - \dot{V}_{out}(t_i)\Delta t \quad (3)$$

$$r(t_i) = \sqrt[3]{3V(t_i)/2\pi} \quad (4)$$

Figure 8:
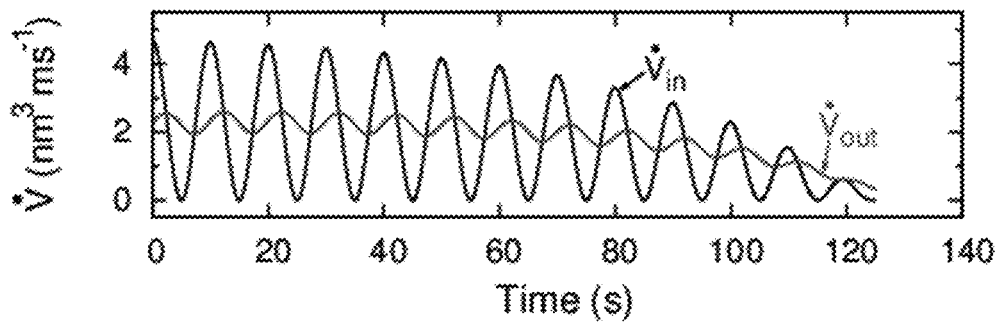
FIG. 8 is a graph of input volume rate ($\dot{V}_{in}$) to droplet for $\tau_{rot}$=10 s and volume rate out ($\dot{V}_{out}$) of the droplet as calculated in each time-step for a rippled branch deposited with the parameters α=85°, T=240° C., R=1 nm/s, $\tau_{rot}$=10 s.
Figure 9:
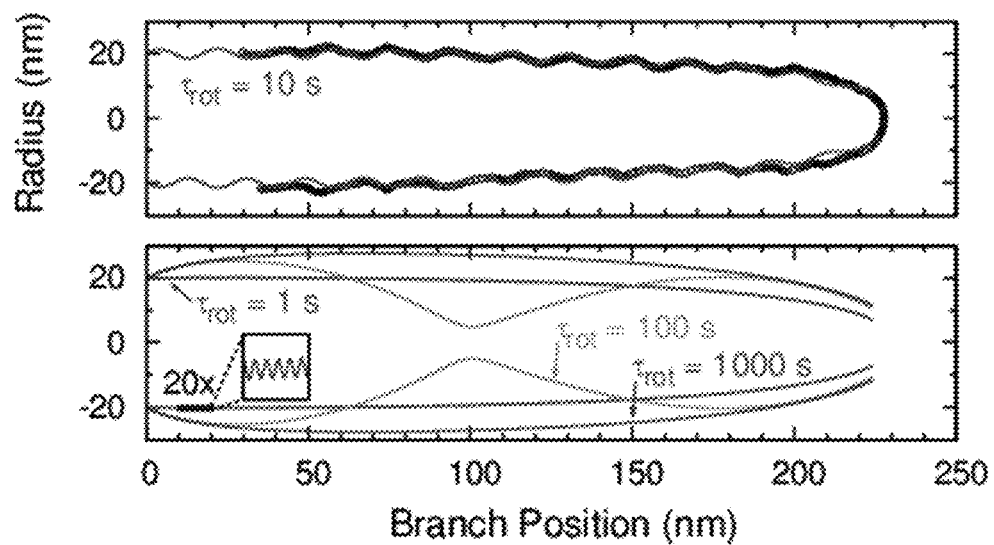
FIG. 9 is a pair of graphs showing (upper graph) an observed branch edge profile (open circles) and simulated branch morphology (solid line) for τrot=10 s and (lower graph) a simulated branch profile for $\tau_{rot}$=1 s, $\tau_{rot}$=100 s, and $\tau_{rot}$=1000 s; y-axis of inset is 1 nm range.

The proposed model reproduces the observed rippling behavior, as shown in FIG. 9 for an example case of a branch. The calculated input and output volume rates ($\dot{V}_{in}$ and $\dot{V}_{out}$, respectively) are shown in FIG. 8 in the case of constant rotation with R=1 nm/s and $\tau_{rot}$=10 s. From a magnified image of the branch, we measure L=225 nm and 13 rippling nodes. Based on the number of nodes and rotation speed, we calculate $t_{max}$=125 s, with $\tau_{LS}$=of 0.13 s. We achieved a fit of the extracted branch profile to the simulated branch profile by varying the envelope parameter ($\alpha$) and capture area (A). A good match is shown in FIG. 9 (upper graph) between the observed and simulated rippling behavior for parameters of $\alpha$=0.025 and A=4900 nm$^2$ (equivalent to a circle with ~39.5 nm radius). Several other rippled branches were simulated (not shown) and all showed good fit with the model.

To explore the conditions for which these rippling effects can be observed, the same simulation was run with different rotation speeds. FIG. 9 (lower graph) shows a simulation of the same parameters, but with $\tau_{rot}$=1 s, and $\tau_{rot}$=100 s, and $\tau_{rot}$=1000 s. In the case of $\tau_{rot}$=1 s, the rippling effect is still present, however, the amplitude of the rippling is so small it is only visible in the magnified inset. For the case of one and two orders of magnitude increase in rotation time, the length of the rippling events is on the order of the branch length. The rippling is effectively lost as a result of the slower rotation times.

Complex Ripple Control. To further validate the hypothesis that rippling is a result of flux starvation, more complex structures were grown by two different methods of controlling the incoming flux to the liquid droplet. This was achieved by controlling the local shadowing function (e.g. changing the rotation rate) and by attenuating the vapor flux directly (e.g. rate control or shuttering). The model indicates that both methods should have a similar effect.

Figure 10:
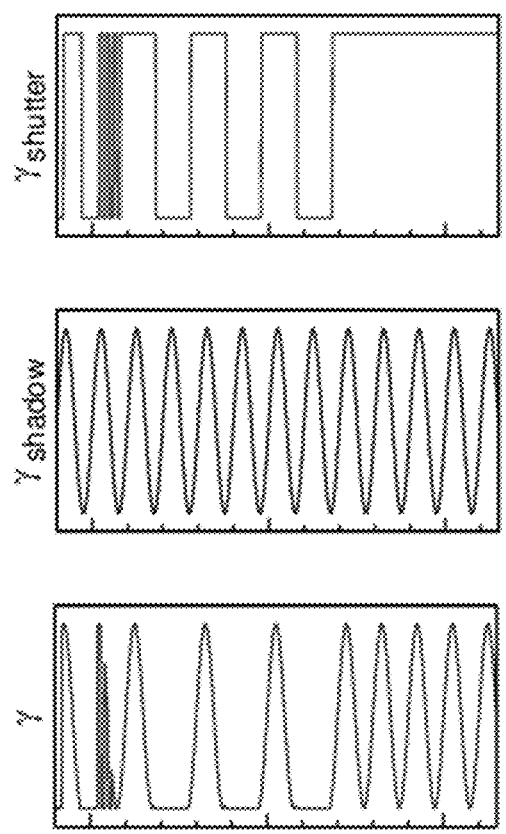
FIG. 10 is a set of graphs displaying, from top to bottom, the flux modulation (γ) due to shuttering, due to rotation-induced shadowing, and the combined shutter-rotation effect on the flux profile, for an example branch. The markings on the horizontal axis indicate 10 second intervals in this example.

We use the flux shutter profile shown in FIG. 10 (upper graph) with constant rotation, to produce an example ITO nanowire. The branch's features follow the shuttering events, controlling ripple amplitude and frequency. The upper and middle graphs of FIG. 10 show the approximate shuttering ($\gamma_{shutter}$) and rotational shadowing ($\gamma_{rotation}$) functions, respectively, resulting in the total flux modulation function ($\gamma$, shown in the lower graph of FIG. 10) contributing to the growth of the magnified branch. In both the shuttering and variable rotation cases, we demonstrate control over the rippling features according to the flux profile. Faster rotation rates result in smaller ripple spacing, and shuttered flux can result in long nodes between ripples. Both the variable rotation and shuttering methods demonstrate (through local shadowing and macroscopically modulated vapor pressure, respectively) direct control over supersaturation in the branch droplets.

We have demonstrated that flux starvation in VLS-GLAD enables controlled branch diameter modulation during ITO nanotree growth, consistent with a simple volume in/out model. Flux starvation can be induced through shadowing or by adjusting the flux rate directly, both general features of VLS-GLAD. The nanostructures made possible by the VLS-GLAD technique should be available to any material system compatible with branched VLS growth.

Droplet diameter is coupled to nanowire properties such as composition, phase, and crystallographic growth direction. Thus, modulation of growth diameter with VLS-GLAD may provide a mechanism to modulate these properties during growth as well. Surface rippling may prove to be a valuable technique to enhance active surface area, create high energy surface defects, or induce phase changes in the material during growth. This technique also allows for the placement of "time stamps" during growth which may allow for improved investigation of time-related growth kinetics.

Single crystal indium tin oxide (ITO) nanotrees with engineered trunk and branch orientations are grown using a recently reported technique combining vapor-liquid-solid growth and glancing angle deposition (VLS-GLAD). In this work, three unique capabilities of VLS-GLAD are demonstrated for the first time: (i) nanotrees are aligned without epitaxy, (ii) branches can be placed on select faces of the nanotree trunk, and (iii) branch orientation can be modified along the height of nanotrees. VLS-GLAD uses a collimated obliquely incident vapor flux to place material on desired growth surfaces, resulting in preferential branch growth on the sides of the nanotree trunk exposed to the flux at the time of nucleation. Dynamic control of the azimuthal orientation of the flux relative to a growing nanotree enables the preferential orientation of branches to be modulated along the height of the nanotree, which we have demonstrated with both continuous and discrete substrate rotation schemes. An electron diffraction investigation confirms that the nanotrees can be considered as a single crystal, with continuity of the crystal structure across the trunk-branch interface. Crystal texture of the films is characterized by x-ray diffraction pole figures. By limiting the flux to discrete positions, the films develop both out-of-plane and in-plane crystal alignment (biaxial texture). We interpret the in-plane orientation as the result of competitive growth which leads to evolutionary selection of similarly oriented structures. Control over in-plane nanotree crystal alignment and height dependent branch orientation should increase the achievable complexity in three dimensional nanowire architectures.

We have used the self-catalyzed indium tin oxide (ITO) system, where catalyst seeding and growth of branches and trunks can be carried out with a single material. In this work, we show that a collimated obliquely incident flux produces preferentially oriented branch growth on ITO nanotrees. Branch growth is enhanced on the side of the nanotree facing the flux and inhibited on the shadowed regions of the trunk. By modulating the azimuthal position of the substrate during growth, we show that preferential branch orientation can be changed along the height of the trunk. We demonstrate these effects in four classes of ITO nanotrees defined by their height dependent branching morphologies: unidirectional, periodic, chiral and isotropic. Additionally, we provide evidence to suggest that an observed preferential azimuthal (in-plane) branch alignment in nanotree films grown without epitaxy, accompanied by a biaxial crystal texture, may be primarily a result of an evolutionary selection mechanism seen in other GLAD work.

EXPERIMENTAL

Films were grown at a nominal temperature of 240° C., deposition angle of 85°, and nominal flux rates of 2 nm s$^{-1}$ and 0.2 nm s$^{-1}$. Pitch is defined as the nominal thickness deposited per substrate rotation. Films grown at 2 nm s$^{-1}$ were deposited with a nominal thickness of 1200 nm, and an infinite pitch p=∞ (no substrate rotation, unidirectional structure), p=1200 nm (1 continuous 360° rotation, chiral structure) and p=10 nm (120 continuous 360° rotations, isotropic structure). A periodically structured film was deposited using spin-pause deposition parameters (2 discrete 180° rotations, periodic structure). For the periodic film, the azimuthal angle was periodically alternated, for a total nominal thickness of 1200 nm ($\phi=0°$ for 0 nm-400 nm; $\phi=180°$ for 400 nm-800 nm; $\phi=360°$ for 800 nm-1200 nm). Films with the same azimuthal modulation schemes were also grown at 0.2 nm s$^{-1}$ to a nominal thickness of 300 nm measured at the CTM (except for the 0.2 nm s$^{-1}$ periodic film, which was grown to a nominal thickness of 450 nm).

Scanning electron microscopy (SEM), electron tomography, selected area electron diffraction (SAED), and x-ray diffraction (XRD) were used to characterize nanotree morphology, crystal texture, and their orientation relative to the flux directions. A Bruker D8 Discover with HiStar area detector acquired XRD line profiles and pole figures of the (400), (222), (440), and (622) diffraction peaks. A Cu Kα radiation source and 0.5 mm collimator was used for each acquisition, with the detector placed ~15 cm from the focal point. Films grown at 2 nm s$^{-1}$ exhibited stronger XRD signals than those at 0.2 nm s$^{-1}$ and were used for the pole-figure study to reduce acquisition time. The pole-figure data was processed using GADDS software. An absorption correction was applied by estimating the film's volume density from substrate mass measurements before and after deposition and accounting for film thickness and area. Radial integration of the pole-figure peaks was performed in GADDS to compare intensity variation in the azimuthal direction to branch orientation data collected from top-down SEM images of the sample taken with a Hitachi S-4800 at 10,000 times magnification. The trunks and branches of the nanotrees typically both grow along a [100] crystal direction, with the trunks tending towards growth along the substrate normal and the branches orthogonal to the trunk. All identifiable branches from four images of each sample were analyzed to compare the azimuthal branch orientations relative to the initial vapor flux direction ($\phi_0$) with ImageJ. Azimuthal orientation of each trunk in films grown at 2 nm s$^{-1}$ was assessed by measuring the orientation of the most predominant branch on each trunk in 8 top-down SEM images (10,000× magnification). The trunk orientation is uniquely defined between 0° and 90° due to the 4-fold symmetry around the <100> direction.

Electron tomography tilt series were acquired on a JEOL 2200 FS TEM/STEM, operated at an accelerating voltage of 200 kV. Bright field TEM (BF-TEM) images were collected from ±65° with 1° steps with tilting axis along the trunk. Lacey carbon grids, which were coated with a 2 nm thick discontinuous gold film, were used as substrates. Assuming that the relative position of the ITO nanotrees and the carbon film does not change, the discontinuous Au film provides us with many markers suitable for alignment with better precision than the size of the Au nanoparticles, i.e. well below a few nm. Reconstruction and visualization were performed using the TEMography™ software package from System In Frontier Inc. The Simultaneous Iterative Reconstruction Technique (SIRT) algorithm was used to minimize the effect of gold particles overlapped with the sample. Electron diffraction analysis was performed on a Hitachi HF3300 TEM/STEM, operated at an accelerating voltage of 300 kV. Cross-section and individual nanotree TEM samples were prepared on a Hitachi NB5000 Focused Ion & Electron Beam System. Nanotrees were scratched off and loaded onto a silicon substrate, and then coated with a 100 nm thick carbon film as a protection layer during the subsequent FIB processing. Individual nanotree samples were plucked out and mounted onto a Hitachi 3D-observation holder by a standard micro-pillar sampling with the tilt axis along the trunk, which enables diffraction analysis from a full 360 degrees.

ITO nanotrees were grown via VLS-GLAD using the four substrate rotation configurations described above and listed in table 1 below (unidirectional, periodic, chiral and isotropic). Substrate rotation is used to control the azimuthal modulation of the flux from the perspective of the growing film. In this work, $\phi$ is used to define the azimuthal position of the vapor flux with respect to the substrate. The azimuthal motion of the flux induces height dependent, preferential branching orientations. The unidirectional nanotrees exhibit an asymmetric branch morphology, with average branch growth primarily directed toward the collimated flux. Periodic modulation between 0° and 180° during growth results in nanotree structures with branches on alternating sides of the trunk, depending on the relative azimuthal orientation of the flux during growth. Slow continuous rotation at a 300 nm pitch produces chiral nanotree structures. The chirality of the branch orientation is expected to follow flux rotation, but this is difficult to confirm with edge view SEM images. As the rotation rate is increased to a 10 nm pitch an isotropic nanotree is obtained. Branches grow uniformly on all four sides of the nanotree, with no observed preferential orientation.

TABLE 1

Nanotree film growth and structure properties

| Name | Pitch (nm) | $\phi$ (°) | Trunk Height (μm) | Trunk Density (μm$^{-2}$) |
|---|---|---|---|---|
| Unidirectional | ∞ | 0 | 5.3 ± 0.3 | 1.15 ± 0.04 |
| Periodic | — | 0, 180, 360 | 4.3 ± 0.1 | 1.32 ± 0.04 |
| Chiral | 1200 | 0 to 360 | 3.3 ± 0.2 | 1.20 ± 0.04 |
| Isotropic | 10 | 0 to 43200 | 3.3 ± 0.2 | 2.45 ± 0.06 |

Table 1 shows deposition conditions and properties of nanotree films deposited at 2 nm s$^{-1}$ to a nominal thickness of 1200 nm.

Figure 11:
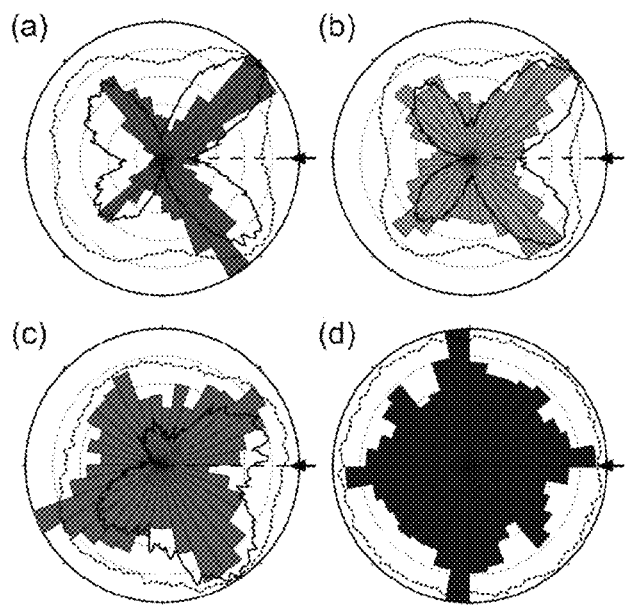
FIG. 11 is a set of Normalized radial histograms illustrating the number of branches counted at azimuthal orientations from $\phi_0$ are shown for (a) unidirectional, (b) periodic, (c) chiral, and (d) isotropic ITO nanotree films grown at 2 nm s$^{-1}$. Integrated intensity from (440) XRD pole figures are illustrated by dotted black lines in the histograms. Solid black lines illustrate the integrated intensity from (440) XRD pole figures with isotropic ITO nanotree background signal subtracted. The initial flux direction ($\phi_0$=0°) is oriented from right to left as indicated by the horizontal dashed black line and arrow in each figure. Rotation of the flux is counter clockwise in (c) and (d). Bin size is 10°, and the outer ring corresponds to a maximum of (a) 99, (b) 111, (c) 75, and (d) 154 counts for each histogram.

Branch orientation was measured with respect to the initial flux axis ($\phi_0$) from plan-view SEM images of the nanotree films grown at 2 nm s$^{-1}$. Normalized radial histograms shown in FIG. 11 display the angular orientation of at least 1371 measured branches in each film. The overlaid lines in FIG. 11 represent crystallographic data which will be discussed later in this work. Branches throughout the unidirectional and periodic films exhibit preferential growth at ±45° and ±135° relative to the flux axis (FIG. 11(a) and FIG. 11(b)). These directions are the result of in-plane crystal orientation of the nanotrees, discussed later. In the unidirectional film, branches oriented ±135° from $\phi_0$ grow on the shadowed side of the trunk, and as a result, are significantly shorter than branches oriented ±45° from $\phi_0$. The low number (FIG. 11a) and short length of branches on the shadowed side of the trunk show the total branch mass on the exposed side of the trunk is substantially greater. Note that in the periodic case, the low number of branches counted with orientations in the second and third quadrants (between 90° and 270°) may be a result of their location midway up the trunk making them difficult to observe in plan-view images (FIG. 11(b)).

Preferential branch orientations are less pronounced in films grown with continuous substrate rotation [FIG. 11c and FIG. 11(d)]. Films of chiral nanotrees appear to exhibit preferential branch orientation but it is far less pronounced than the unidirectional or periodic films. Isotropic films exhibit faint or no preferred orientation. As substrate rotation rate is increased, the vapor flux is effectively azimuthally isotropic, and as a result, preferential branch orientation is significantly reduced (FIG. 11(d)).

Overall, branches tend to grow on the region of trunks exposed to flux at the time of nucleation. This suggests branch nucleation occurs preferentially within a limited proximity to where the trunk is directly exposed to the collimated vapor flux. Branch nucleation due to surface diffusion vertically and azimuthally about the trunk appears to be limited as shown by the abrupt change in branch orientation midway up the periodic nanotrees and reduced branching on the shadowed surface in FIG. 11(a). However, branch growth is observed in several instances on regions of the trunk that were shadowed during the time of nucleation FIG. 11(a). This suggests that although branch nucleation is suppressed on shadowed surfaces due to flux starvation, a combination of surface diffusion around the trunk cross-section and re-evaporation from adjacent surfaces is sufficient to nucleate branches within the shadowed region. Once nucleated, these branches may grow by becoming directly exposed to the flux, or by collecting material from surface diffusion and re-evaporation. The branches on the shadowed side of unidirectional nanotree trunks are significantly shorter, suggesting that branch growth rate is dominated by direct flux capture. Improved understanding of the surface diffusion limits, combined with the development of substrate motion configurations optimized to deliver flux near desired growth surfaces may allow enhanced branch placement.

Volumetric reconstructions of an isotropic nanotree grown at 2 nm s$^{-1}$ were determined. The relative orientation of the nanotree trunk and branches can be clearly seen: branches grow orthogonally on four sides of the trunk, and normal to the main trunk. The square faceting of the trunk cross-section is clearly visible in a cross sectional slice, and can be confirmed with TEM image of a cross sectional sample. The presence of a corner likely reduces the probability of surface diffusion azimuthally about the trunk due to the presence of a 3D Schwoebel-Ehrlich barrier agreeing with our observations of limited branch nucleation on shadowed surfaces.

As the trunks grow vertically, in the substrate normal direction, it is expected that geometric shadowing gradually starves branches of flux deeper in the film. Branches far beneath the nanotree tops are not expected to receive a significant amount of flux from re-evaporation because surrounding adatoms will have had time to thermalize and be incorporated into the solid state. Similarly, material from surface diffusion becomes increasingly limited as branches closer to the growth surface will act as sinks to captured flux. This effect places an upper limit on the time that a branch may continue to receive growth material and therefore limits branch length. The effect is apparent by the relatively uniform branch length with increasing trunk height, and agrees with our previous observations of reduced growth rate as branches become occluded from the flux.

Figure 12:
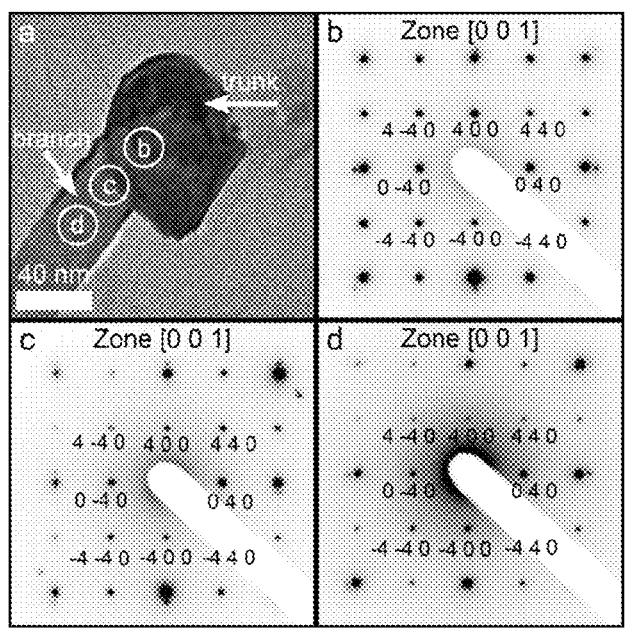
FIG. 12 is a TEM image of a nanotree cross-section at a branch-trunk interface is shown in (a). Electron diffraction patterns were taken at locations indicated by the white circles: (b) trunk, (c) trunk-branch interface and (d) branch.
Figure 13:
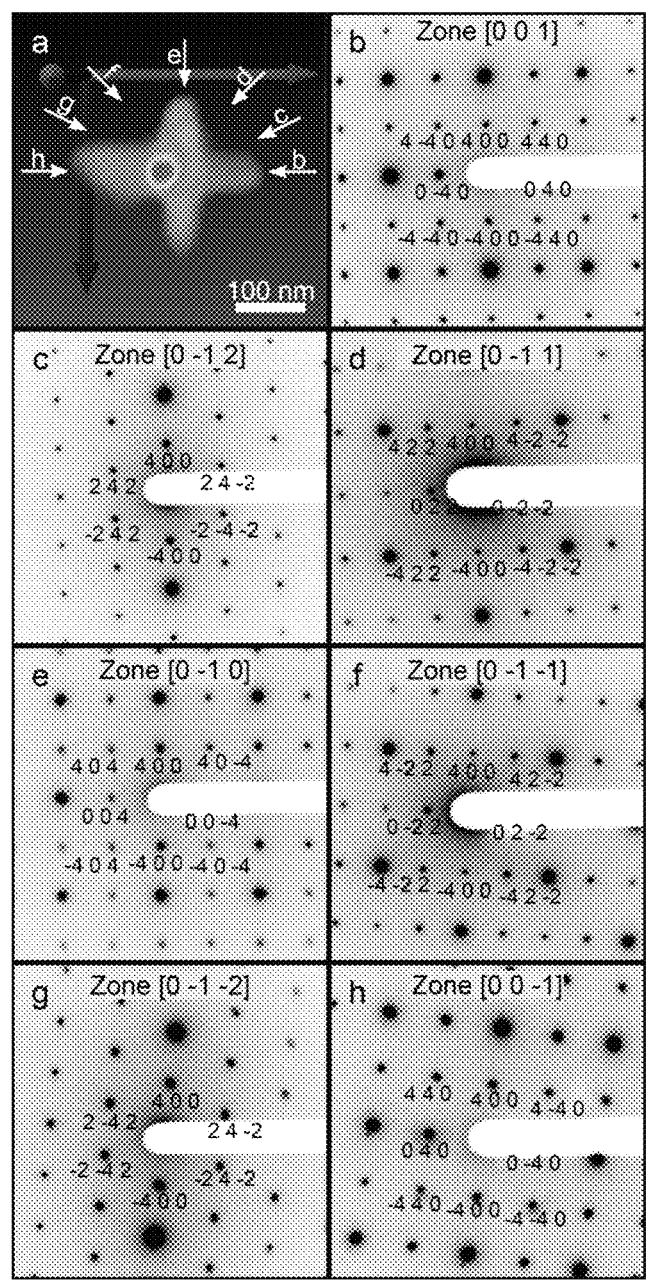
FIG. 13 is a projection view (a) of a nanotree along its trunk obtained from a volumetric rendering along with images of diffraction patterns (b) to (h) taken at the locations shown by the labeled white arrows in (a).

Electron and x-ray diffraction were used to examine the crystal structure of individual nanotrees and texture of the nanotree ensembles, respectively. Diffraction profiles of the four nanotree morphologies discussed here are consistent with a cubic crystal structure (space group Ia3$^-$, 01-089-4597). Identical electron diffraction patterns obtained from trunk, branch and their interface of a nanotree cross-section confirm that each nanotree is a single crystal and that branches exhibit epitaxial growth on the trunk, as shown in FIG. 12. Electron diffraction patterns were taken along branch axes as well as at intermediate directions from a single nanotree sample with the electron beam normal to the trunk at all directions (FIG. 13). A branch growth orientation of [0 0 1] can be derived from zone axes of diffraction patterns along the branch axes shown in FIGS. 13b,e and h. Trunk growth orientation is [1 0 0] [FIG. 12], which is normal to the substrate and zone axes of all patterns in FIG. 13.

Figure 14:
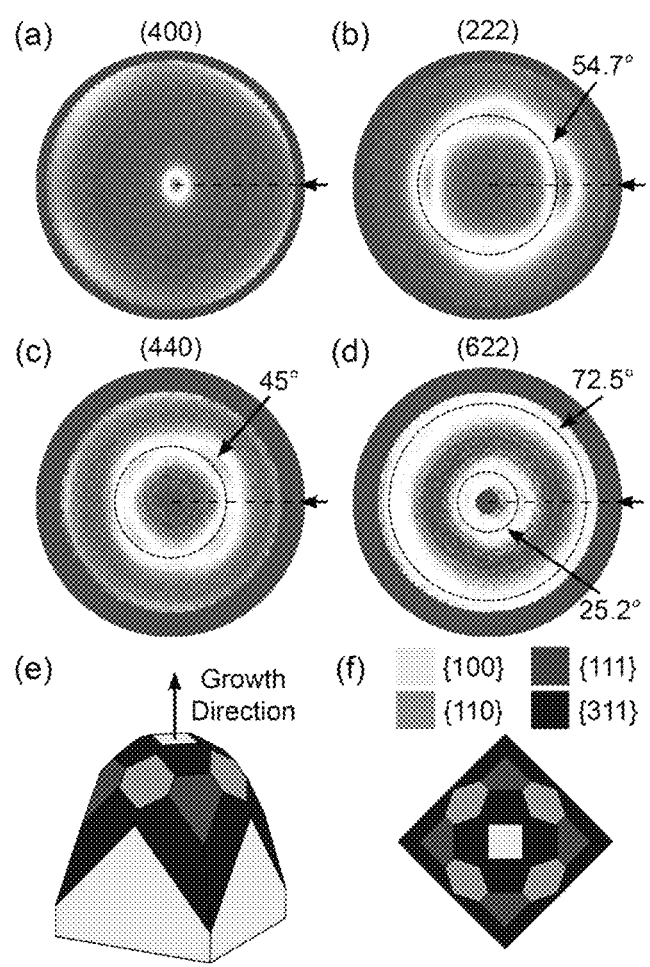
FIG. 14 shows XRD pole figures obtained from a periodic ITO nanotree film for (a) (400), (b) (222), (c) (440) and (d) (622) planes. The initial flux direction ($\phi_0$=0°) is oriented from right to left as indicated by the horizontal dashed black line and arrow for each pole figure. The dashed circles indicate the expected radial positions for x-ray diffraction around a single crystal nanotree oriented [100] normal to the substrate. A schematic illustrating the crystal structure and facets of a single crystal ITO nanotree trunk growing in the [100] direction are shown from (e) cross-sectional and (f) top-down perspectives. Branch growth occurs in the four {100} directions normal to the trunk. WinXMorph software was used to obtain (e) and (f).

X-ray pole figures of the (400), (222), (440), and (622) diffraction peaks were taken to characterize the overall crystal texture and its relationship to the flux direction and branch orientation for each film. FIG. 14 shows the pole figures for the periodic nanotree film. All four morphologies have <100> out-of-plane texture, preferring to grow with the <100> direction/trunk axis aligned parallel to the growth direction/substrate normal. Schematics shown in FIGS. 14e and f demonstrates the expected orientation relationship between the {100}, {111}, {110} and {311} planes for a single crystal of ITO (m3 point symmetry) with <100> out-of-plane texture. Agreement between the expected and observed radial positions of the (222), (440), and (622) peaks is observed in FIGS. 14b-d for the periodic film. A slight tilt towards the flux direction exists in all of the pole-figures. It is possible that sample tilt within the goniometer could be responsible for this effect.

Of the four morphologies, only the periodic and unidirectional structures have a clear biaxial texture, showing both in-plane and out-of-plane orientation (FIG. 14). The four fold-symmetry and azimuthal positions of the (222), (440) and (622) peaks correspond to the expected positions for a <100> out-of-plane oriented single crystal nanotree. For both periodic and unidirectional films, the (222) and (622) are oriented towards the flux, whereas the (440) peaks are offset by 45°. Thus, the vapor-incidence plane occurs parallel to (110) and the films exhibit [100](110) biaxial texture, following the notation of Abelmann and Lodder.

The observed out-of-plane texture is due to the preferred growth direction of ITO nanotrees grown via VLS. In-plane texture is observed for the unidirectional and periodic films, where the vapor-incidence plane is parallel to the (110) direction, and is reduced or lost when the substrate is continuously rotated for the chiral and isotropic films, respectively. Development of in-plane texture is often attributed to an evolutionary selection process in oblique deposition, and is discussed further below.

The x-ray and electron diffraction data indicate that the nanotrees are single crystal with the trunks and branches growing in orthogonal [100] crystallographic directions. Thus, in-plane crystal orientation should be accompanied by a preferential branch orientation that is consistent with a [100] epitaxial relationship between a trunk and branches. To confirm this relationship, (440) pole figures were radially integrated to produce polar-plots, where the radial distance corresponds to the diffraction intensity, and overlaid onto the branch histograms (FIG. 11). We used the (440) pole-figure because the relative azimuthal position of these diffraction peaks corresponds to the position of [100] oriented branches (FIG. 8f). The results of this comparison show that for each film in FIG. 11, the preferential branch orientation follows the diffracted intensity of the (440) pole figure consistent with branch growth in a [100] direction orthogonal to the trunk.

(440) pole figures exhibit peaks at ±45° and ±135° relative to the flux axis in the unidirectional and periodic films, establishing a link between the observed in-plane texture in these films and branch orientation [FIGS. 11a and 11b]. Although the periodic and unidirectional films have similar in-plane texture, the branch directions in the periodic film have a height dependence whereas the unidirectional films do not. This suggests that the in-plane texture can be maintained while changing the preferential branch orientation along the height of the trunks during growth as long as the flux directions reflect the crystal symmetry of the trunks. The reduced intensity seen in the chiral film between 90° and 180° [FIG. 11c] is difficult to explain. The flux is in this region relatively early in the growth, and it may be the branching rate is suppressed in that period. In all cases, the diffraction intensity appears to reflect the branch count or total branch mass.

A potential mechanism to drive the evolutionary selection process is the difference in flux capture cross-section of the square trunks. Nanotrees with a {100} trunk face oriented 45° from the flux axis ($\phi_0$) present the largest surface from the perspective of the collimated flux and therefore, capture more vapor from the flux that can diffuse to the trunk droplet and produce vertical growth. Therefore, nanotrees oriented with a vertex of their square trunk cross-section pointing towards the flux should exhibit the fastest vertical growth rate. The faster growth rate will cause increased flux shadowing for neighboring trees that do not exhibit the preferred orientation, further suppressing their growth. Preferred branch nucleation and growth on the {100} faces of the trunk oriented ±45° from $\phi_0$ may increase the flux capture cross-section of these orientations at a higher rate than other orientations, further amplifying their competitive advantage. Thus, only nanotrees oriented favorably towards the flux are expected to avoid extinction, and continue to grow in the film.

One consequence of the evolutionary selection process is that films consisting of relatively short nanotrees should not exhibit in-plane texture since trunks are randomly oriented in the early stages of growth prior to the extinction of less flux-favored orientations. Indeed, no in-plane texture is detected in a (222) pole figure of a unidirectional film grown under the same conditions but to less than one tenth the nominal thickness. A second consequence is that relaxation of the selection pressure should increase the number of nanotrees that survive, and this is observed in the high trunk density observed in the isotropic film seen in Table 1. A third consequence is that films with selection pressure should consist of taller nanotrees than those without, as the selected nanotrees should grow faster vertically due to increased flux capture distributed among fewer nanotrees. From Table 1, we can see that both the unidirectional and periodic nanotrees are taller than chiral and isotropic nanotrees. However, this description does not capture any effects from varying branch density or differences in trunk/branch diameter, and must be considered a preliminary hypothesis at this time.

Figure 15:
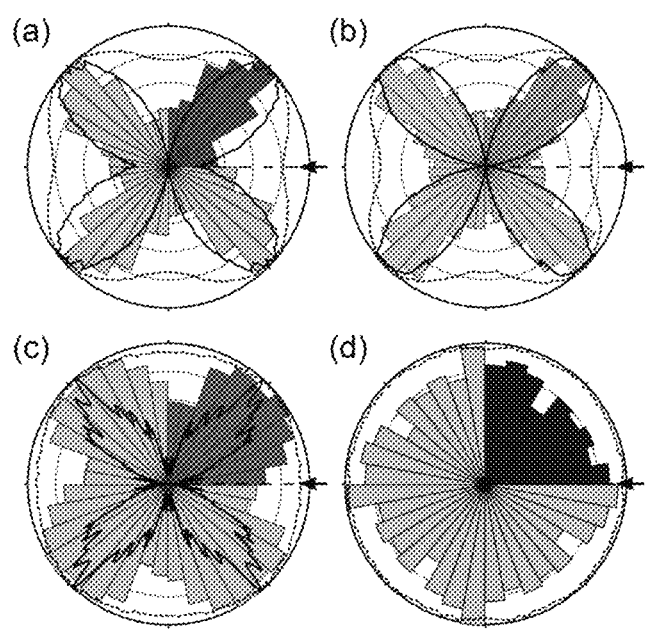
FIG. 15 is a set of normalized radial histograms illustrating the number of trunks oriented with a certain angle from $\phi_0$ for (a) unidirectional, (b) periodic, (c) chiral and (d) isotropic ITO nanotree films grown at 2 nm s$^{-1}$. The colored regions between 0° and 90° provide all the unique trunk orientations due to the four fold symmetry of the square cross-section of an ITO nanotree trunk. The data was mirrored around the origin for clarity, indicated by the grey bars. Symmetrized pole figure data was radially integrated and plotted over the histograms, as shown by the solid black (isotropic background subtracted) and dotted black (with isotropic background) lines. The initial flux direction ($\phi_0=0°$) is oriented from right to left as indicated by the horizontal dashed black line and arrow in each figure. Bin size is 10°, and the outer ring corresponds to a maximum of (a) 186, (b) 219, (c) 144, and (d) 281 counts for each histogram.

We measured the azimuthal crystal orientation of trunks with respect to $\phi_0$ in order to investigate the competitive growth hypothesis. The 4-fold symmetry observed in the branch histograms provides evidence for biaxial texture in the unidirectional and chiral films [FIG. 11], however, they do not quantify the extent of trunk alignment. Additionally, the radially integrated pole figure intensity in FIG. 11 was observed to depend on branch mass, therefore the extent of azimuthal trunk alignment remains uncertain. Measuring trunk orientation allows a direct morphological measurement of the preferential in-plane alignment of nanotrees, providing additional confirmation of the evolutionary selection mechanism. We have shown that branches are an extension of the trunk's cubic crystal lattice [FIG. 12], thus the orientation of a single branch uniquely identifies the azimuthal crystal orientation of a trunk. Therefore, the orientation of a single branch was measured for each trunk and assembled into radial histograms (unique between 0° and 90° due to cubic symmetry) shown in FIG. 15. Symmetrized pole figures were radially integrated and plotted in polar coordinates over the trunk histograms, resulting in good agreement. FIG. 15 shows that nanotrees with {100} trunk faces oriented 45° from $\phi_0$ are predominant in the unidirectional, periodic and chiral nanotree films, while the isotropic film exhibits a uniform distribution of trunk orientations. Consistent with the model for selection described above, the trunks that survive the competitive growth process are those that exhibit the largest flux capture cross-section from the perspective of the collimated vapor flux in the unidirectional and periodic films. The presence of favored trunk orientations in the chiral nanotree film suggests a slight selection pressure is applied early in growth due to slow rotation and is maintained as the nanotrees grow, agreeing with the relatively faint biaxial texture observed in the radially integrated pole figure data (FIGS. 11c, 15c). As substrate rotation rate is increased, the flux is not stationary a sufficient time to apply significant selection pressure, leading to an absence of clearly observable biaxial texture, and favorable trunk orientations [FIG. 15d]. The quantification of the extent of trunk alignment supports the hypothesis that preferential alignment of branches results primarily through an evolutionary selection mechanism of favored trunk orientations, rather than occurring solely due to increased nucleation probability of branches on trunk faces that capture the most flux.

Single crystal ITO nanotrees grown with VLS-GLAD have trunks and branches occurring in orthogonal [100] directions of ITO's cubic crystal structure. We show that branch placement can be changed along the height of the trunk during growth by modulating the azimuthal position of a collimated vapor flux relative to the trunk axis. Although we have demonstrated this effect in a self-catalyzed VLS system, this technique should be applicable to all other VLS systems where catalyst seeds can be distributed uniformly around the trunk surface. When the flux is constrained to one position or two discrete positions with 2-fold azimuthal symmetry, in-plane alignment of the structures develops. This results in biaxial texture of the nanotree ensemble, as well as 4-fold azimuthal symmetry of the branch directions. Typically, in-plane alignment of nanotrees depends on enforcing an epitaxial relationship with the substrate, but it has been demonstrated on amorphous substrates here. Using VLS-GLAD, it should be possible to induce biaxial texture in any VLS system without requiring epitaxy by matching the flux symmetry to the crystal symmetry around the growth axis. In general, the use of a directed, collimated vapor flux used in VLS-GLAD as opposed to the more common isotropic flux has advantages that should be useful in fabricating complex, interconnected, three-dimensional nanowire networks.

The surface properties of the substrate can be geometrically designed to invoke a specific behavior in the growing nanowires. A geometric design is placement of either self-catalyzed material or catalyst seeds on a substrate, substrate topography, or existing nanowires before or during a certain VLS growth step. Such arrangements may be produced by methods such as photolithography, nanosphere lithography, electron beam lithography, etching, or glancing angle deposition. The arrangement of catalyst droplets may be a repeating pattern, a set of multiple patterns, or aperiodic in nature. Examples of such patterns include complete or partial square, hexagonal, and linear arrangements. The geometry is selected to produce a desired two- or three-dimensional arrangement of nanowires after VLS growth. Chemical patterning or geometric patterns to induce nucleation could also be used, including microscale surface topography patterns.

Immaterial modifications may be made to the embodiments described here without departing from what is covered by the claims.

In the claims, the word "comprising" is used in its inclusive sense and does not exclude other elements being present. The indefinite articles "a" and "an" before a claim feature do not exclude more than one of the feature being present. Each one of the individual features described here may be used in one or more embodiments and is not, by virtue only of being described here, to be construed as essential to all embodiments as defined by the claims.

The embodiments of the invention in which an exclusive property or privilege is claimed are defined as follows:

1. A method of producing branched nanowires comprising:
   exposing a substrate to a directional vapor flux, the vapor flux comprising a growth material, the substrate being exposed to the vapor flux under conditions of vapor-liquid-solid growth of the branched nanowires, the conditions including a temperature of the substrate, the vapor flux having a deposition angle representing the angle between a normal direction of the substrate and the direction of the vapor flux, an azimuthal angle representing an angle of the projection of the direction of the vapor flux in the plane perpendicular to the normal direction of the substrate, and a flux rate;
   varying at least one of the deposition angle, the azimuthal angle, the flux rate and the temperature to control a property of the branched nanowires; and
   in which the branched nanowires have crystal facets and at least one of the deposition angle, the azimuthal angle and the flux rate is controlled to selectively and sequentially direct the vapor flux to a subset of the crystal facets of a nanowire of the branched nanowires.

2. The method of claim 1 used to align in azimuth a plurality of the branched nanowires.

3. The method of claim 2 in which the alignment of the plurality of nanowires changes with height.

4. The method of claim 1 in which at least an additional source of vapor flux is used.

5. The method of claim 4 in which at least one of the orientation, position, flux rate and material of the at least an additional vapor source varies in time.

6. The method of claim 1 in which the nanowires are grown on a substrate with an epitaxial relationship to the nanowires' growth material.

7. The method of claim 1 in which the nanowires are grown on a substrate without an epitaxial relationship to the nanowires' growth material.

8. The method of claim 1 in which the substrate is one of a semiconductor, glass, smooth thin film, columnar thin film, or nanostructured thin film.

9. The method of claim 1 in the substrate has surface properties causing the nanowires to cluster in a region of the substrate.

10. The method of claim 9 in which the surface properties of the substrate are geometrically designed to invoke a specific behavior in the growing nanowires.

11. The method of claim 1 in which the azimuthal direction of the vapor flux rotates continuously clockwise or continuously counterclockwise.

12. The method of 1 in which the azimuthal direction of the vapor flux oscillates with an amplitude between 1 degree and 359 degrees.

13. The method of claim 1 in which the azimuthal direction of the vapor flux changes discretely.

* * * * *